US007583834B2

(12) United States Patent
McCollough et al.

(10) Patent No.: US 7,583,834 B2
(45) Date of Patent: Sep. 1, 2009

(54) LASER ETCHED FIDUCIALS IN ROLL-ROLL DISPLAY

(75) Inventors: George T. McCollough, Penfield, NY (US); Mark C. Rzadca, Fairport, NY (US); David C. Press, Webster, NY (US); James S. Honan, Spencerport, NY (US)

(73) Assignee: Eastman Kodak Company, Rochester, NY (US)

( * ) Notice: Subject to any disclaimer, the term of this patent is extended or adjusted under 35 U.S.C. 154(b) by 935 days.

(21) Appl. No.: 11/072,077

(22) Filed: Mar. 4, 2005

(65) Prior Publication Data

US 2006/0199088 A1 Sep. 7, 2006

(51) Int. Cl.
*G06K 9/00* (2006.01)

(52) U.S. Cl. ............... 382/151; 250/492.2; 356/369; 356/400; 438/401; 438/462

(58) Field of Classification Search ............... 174/255, 174/256, 257; 257/637, 638, 752, 797; 382/141, 382/145, 151; 438/149, 401, 459, 462, 720; 250/492.2, 548; 356/369, 399, 400, 401
See application file for complete search history.

(56) References Cited

U.S. PATENT DOCUMENTS

| | | | | |
|---|---|---|---|---|
| 4,431,923 A * | 2/1984 | Wang et al. | ............... | 250/491.1 |
| 5,128,283 A * | 7/1992 | Tanaka | ............... | 438/703 |
| 5,231,471 A * | 7/1993 | Torigoe | ............... | 356/401 |
| 5,477,058 A * | 12/1995 | Sato | ............... | 250/548 |
| 5,528,372 A * | 6/1996 | Kawashima | ............... | 356/401 |
| 5,567,329 A | 10/1996 | Rose et al. | | |
| 6,236,442 B1 | 5/2001 | Stephenson et al. | | |
| 6,242,792 B1 * | 6/2001 | Miura et al. | ............... | 257/536 |
| 6,339,471 B1 * | 1/2002 | Morita | ............... | 356/401 |
| 6,350,680 B1 * | 2/2002 | Shih et al. | ............... | 438/637 |
| 6,394,870 B1 | 5/2002 | Petruchik et al. | | |
| 6,417,922 B1 * | 7/2002 | Dirksen et al. | ............... | 356/401 |
| 6,525,818 B1 * | 2/2003 | Yin et al. | ............... | 356/400 |
| 6,558,774 B1 * | 5/2003 | Saliba et al. | ............... | 428/156 |
| 6,566,157 B2 * | 5/2003 | Ohtaka | ............... | 438/48 |
| 6,591,490 B1 | 7/2003 | Ross et al. | | |
| 6,625,357 B2 | 9/2003 | Bowen et al. | | |
| 6,668,449 B2 | 12/2003 | Rumsey et al. | | |
| 6,696,325 B1 * | 2/2004 | Tsai et al. | ............... | 438/149 |
| 6,765,603 B2 | 7/2004 | Border et al. | | |
| 6,811,938 B2 | 11/2004 | Tutt et al. | | |
| 6,841,486 B2 | 1/2005 | Boudreau et al. | | |
| 6,930,255 B2 * | 8/2005 | Wakihara et al. | ............... | 174/250 |
| 6,933,988 B2 * | 8/2005 | Ohgami et al. | ............... | 349/39 |
| 6,936,195 B2 * | 8/2005 | Fan et al. | ............... | 264/1.33 |
| 7,030,506 B2 * | 4/2006 | Zaidi et al. | ............... | 257/797 |

(Continued)

FOREIGN PATENT DOCUMENTS

WO          00/68972          11/2000

*Primary Examiner*—Gregory M Desire

(57) ABSTRACT

The present invention relates to a method of aligning comprising providing a support, applying a transparent layer, patterning at least the transparent layer to produce a pattern and an alignment feature capable of scattering light, illuminating the support and the transparent layer with oblique lighting, providing an analysis system capable of sensing scattered light from the alignment feature and referencing, sensing the scattered light from the alignment feature; referencing the scattered light from the alignment feature to a position on said support; and aligning a second operation to the position.

36 Claims, 9 Drawing Sheets

U.S. PATENT DOCUMENTS

| | | | |
|---|---|---|---|
| 7,160,654 B2 * | 1/2007 | Tsai | 430/22 |
| 7,223,672 B2 * | 5/2007 | Kazlas et al. | 438/458 |
| 7,353,598 B2 * | 4/2008 | Craig et al. | 29/846 |
| 7,422,962 B2 * | 9/2008 | Chen et al. | 438/456 |
| 2002/0109775 A1 | 8/2002 | White et al. | |
| 2002/0109843 A1 | 8/2002 | Ehsani et al. | |
| 2002/0127857 A1 * | 9/2002 | Ohgami et al. | 438/689 |
| 2003/0132025 A1 * | 7/2003 | Wakihara et al. | 174/256 |
| 2003/0228229 A1 | 12/2003 | Yoshimura et al. | |
| 2004/0014265 A1 * | 1/2004 | Kazlas et al. | 438/200 |
| 2005/0059255 A1 * | 3/2005 | Varnerin et al. | 438/720 |
| 2006/0199088 A1 * | 9/2006 | McCollough et al. | 430/30 |

* cited by examiner

LASER ETCHED FIDUCIALS IN ROLL-ROLL DISPLAY

FIELD OF THE INVENTION

The present invention relates to a method for providing a particular alignment feature on a component layer of a multilayer product.

BACKGROUND OF THE INVENTION

In the manufacture of electronic devices, such as liquid crystal displays, where multiple layers of patterned materials are combined to form the display, precise registration of the layers is critical for proper function and acceptable performance.

A liquid crystal display (LCD) is a type of flat panel display used in various electronic devices. At a minimum, an LCD comprises a support, such as glass or plastic, at least one conductive layer and a liquid crystal layer. LCDs may also be more complex and have additional components. For example, an LCD may comprise a transparent, multilayer flexible support, coated with a first patterned conductive layer and coated with a light-modulating liquid crystal layer. A second conductive layer is applied and overcoated with a dielectric layer to which dielectric conductive row contacts are attached, including via holes that permit interconnection between conductive layers and the dielectric conductive row contacts. Other optional functional layers may be applied between the various layers.

The manufacture of display articles in a roll-to-roll fashion is of great interest for the purpose of providing low cost and flexible displays. U.S. Pat. No. 6,394,870 describes a liquid crystal display comprising a cholesteric liquid crystal layer disposed on a patterned conductive layer on a flexible support, with a second conductor that is screen printed in a pattern over the liquid crystal layer. Screen printed dielectric materials with via holes and additional conductive materials are further described. Precise alignment of the patterned second conductor over the first patterned conductive layer in the screen printing operation, precise alignment of the via holes in the screen printed dielectric layer over the second conductor, and precise alignment of the conductive traces over the via holes are all critical steps for the proper function of the display.

An attractive option during manufacture of liquid crystal displays is to screen or ink jet print conductive material as pads for interconnections to the drive electronics directly on the patterned first conductor on the flexible support in an area not covered with liquid crystal or other coatings. In this case, precise alignment of the printed pad to the patterned first conductor is a critical step if the width of the pad approaches the width of the patterned first conductor segment.

U.S. Pat. Application 2004/0048173 discloses a method of aligning a substrate or support for use in manufacture of organic light emitting (OLED) displays with a laser which produces a beam that causes the transfer of organic material from a donor element to the substrate, including providing at least one fiducial mark on the substrate; positioning the substrate relative to the laser and providing relative movement between the substrate and the laser and the laser beam until the laser beam impinges upon the fiducial mark; and detecting when the laser beam impinges upon the fiducial mark and determining the position and orientation of the substrate. The method disclosed in U.S. Pat. Application 2004/0048173 requires that the fiducial mark be present prior to laser deposition and the laser is part of a system to detect the fiducial and to position the subsequent deposition pattern by the laser to the determined position. This differs significantly in that the fiducial pre-exists and should be aligned with some associated alignment error the magnitude of which is a function of the precision of the alignment system but cannot be completely avoided. In the case of the invention disclosed herein, the fiducial is etched by the laser as part of the etch pattern eliminating the alignment error between the fiducial and the pattern.

U.S. Pat. No. 6,668,449 discloses a novel design for a fiducial and pin one indicator that utilizes a single solder resist opening in a die mounting support to perform the combined functions of prior art fiducials and pin one indicators. Methods of fabricating a carrier substrate and fabricating a semiconductor device package using the combination pin one indicator and alignment fiducial of the present invention are also provided. Preferably, the pin one indicator/alignment fiducial is placed adjacent a corner area of a ball grid array, and comprises an "L"-shaped narrow opening in a solder mask layer in which two lines, mutually perpendicular to one another, form components of an X-Y axis. The pin one indicator/alignment fiducial of the present invention is configured to provide only a minimal opening in the solder resist, making smaller pitches between solder balls and tighter dimensional controls possible. Therefore, the present invention is particularly useful for packages in which the solder resist surface of the mounting substrate is heavily populated with solder ball contact pads and/or and solder balls, and/or in applications where the chip outline is nearly the same size as the package (e.g., Chip Scale Packages (CSP), Near Chip Size (NCS), etc This invention differs significantly, in that the single solder resist opening pertains to die mounting. Further, the fiducial is an opening in the solder resist on a die mounting support, instead of etched areas of ITO and flexible substrate. Still further, the etched fiducial in the ITO is detected and used for alignment. Detection is difficult except for the dark field and incident light methodology.

U.S. Pat. No. 6,236,442 discloses a display and a method of making a display for presenting selected images to a viewer, including a transparent substrate; a transparent, electrically conductive coating formed over the transparent substrate; a light modulating layer formed over the transparent, electrically conductive layer; and a patterned conductive layer formed over the light modulating layer which provides viewable and conductive images, the light modulating layer being effective in two conditions, in a first condition to prevent the viewing of the viewable and conductive images and in a second condition to permit the viewing of the viewable and conductive images. The display is formed by providing a transparent substrate; forming a transparent, electrically conductive coating over the transparent substrate; forming a light modulating layer including liquid crystal material in a polymer binder over the transparent, electrically conductive layer; forming a metallic conductive layer directly on the light modulating layer and removing selected portions of the metallic conductive layer to provide viewable and conductive images, and providing electrical connection so that an electrical field can be applied across selected ones of such viewable and conductive images and the transparent, electrically conductive layer to cause the light modulating layer underlying the selected ones of the viewable and conductive images to change from the first condition to the second condition so as to present such viewable and conductive images for viewing to the viewer.

Application of the current art of a printed ink or stamped out hole serving as an alignment feature created on the flexible support prior to the patterning of the first conductive layer complicates the patterning process as the pattern should be positioned relative to the alignment feature. The magnitude of the resulting alignment error is a function of the sophistication of the patterning equipment. However large or small, the error propagates through all future alignment steps increasing the overall error. In order to avoid this error, the alignment feature should be created in the transparent conductive support during the patterning step, however there is still a need for reading the nearly transparent alignment indicia.

Problem To Be Solved

There remains a need to provide for the precise alignment of patterns of materials during fabrication of liquid crystal displays on flexible support within the tolerances required of the display. There remains a need to provide for the precise alignment of patterns of materials during fabrication. There is further a need for precise alignment of transparent conductive layers with subsequently provided patterned materials. There is a need for reading nearly transparent alignment features.

SUMMARY OF THE INVENTION

The present invention relates to a method of aligning comprising providing a support, applying a transparent layer, patterning at least the transparent layer to produce a pattern and an alignment feature capable of scattering light, illuminating the support and the transparent layer with oblique lighting, providing an analysis system capable of sensing scattered light from the alignment feature and referencing, sensing the scattered light from the alignment feature; referencing the scattered light from the alignment feature to a position on said support; and aligning a second operation to the position.

ADVANTAGEOUS EFFECT OF THE INVENTION

The present invention includes several advantages, not all of which are incorporated in a single embodiment. The new concept can eliminate a separate step of providing an alignment feature. This provides the advantages of eliminating the cost, time, inventory and any waste associated with the separate step to provide an alignment feature, it reduces the complexity of the laser etching equipment, since there is no need for a precision alignment feature. Another important advantage is that the error associated with aligning the patterning of the transparent conductive layer in the laser etcher is avoided, thus increasing the manufacturing yield and/or providing the capability to produce displays with finer features. This is all made possible due to the method of reading the fiducial can provide for aligning nearly transparent fiducial marks.

DETAILED DESCRIPTION OF THE INVENTION

Figure 1:
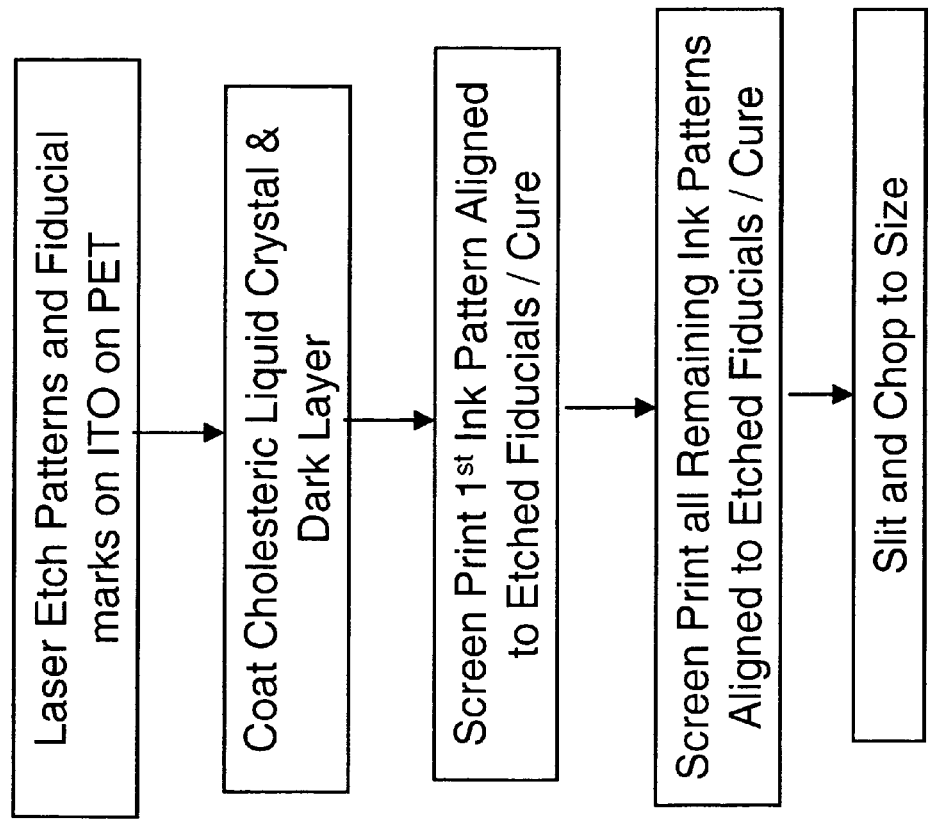
FIG. 1 is a schematic of the process flow chart for producing flexible displays.

The present invention relates to a method of aligning comprising providing a support bearing a patterned transparent layer also patterned with an alignment feature capable of scattering light, obliquely lighting the support, providing an analysis system, capable of sensing the scattered light from the alignment feature and referencing the alignment feature to a position on the support, and aligning one or more subsequent operations to the position marked by the alignment feature.

The goal of detecting a particular alignment feature on a component layer of a multilayer product is to enable utilization of the first etching process to produce both the functional modification to the layer and alignment features for subsequent steps. This provides an opportunity for improved precision in the alignment of the subsequent features to the first etched feature set due to elimination of one instance of the variability of locating a set of alignment features.

The alignment feature is generally etched by a laser at different and much harsher conditions than the conditions used to etch patterns into the ITO on the flexible substrate. The surface of the flexible substrate where the alignment feature may potentially exist can be damaged in a controlled way by the laser to make this surface easily detectable when exposed to incident light. In other embodiments, the patterned transparent layer is also patterned with an alignment feature capable of scattering light such as during a printing operating. Such printing operations can include inkjet printing, gravure printing, and flexographic printing. The alignment feature may also be present in more than a single layer, such as, for example, an etched, patterned layer in which the etching also etched the underlying substrate.

Multiple operations can follow the patterning step in which the pattern and alignment feature are created. These operations may include screen printing, inkjet printing, thermal printing, removal of material via skiving or laser ablation. Some operations may be conducted which do not depend on the detection of the alignment features, such as coating and winding.

There are many lasers than can create easily detectable alignment fiducials in ITO. In one distinguished embodiment, an alignment feature of a 0.05 inch diameter circle 25% filled in with etched lines is created on 300 ohm/square ITO on PET by a 1064 nm YAG laser pulsed at 20 kHz with an 80 micron spot size advancing at 240 millimeters per second. In a second distinguished embodiment, an alignment feature of a 0.05 inch diameter circle 25% filled in with etched lines is created on 300 ohm/square ITO on PET by a 355 nm UV laser pulsed at 10 kHz with a 40 micron spot size advancing at 130 millimeters per second.

The alignment feature created during the etching of the support, serves to align each subsequent layer that is patterned to the first conductor etched in the transparent conductive layer on the flexible support. In the case of a segmented display, after the LC layer and functional layers are coated on the support, subsequent printing of conductive segments, dielectric and conductive traces uses the alignment feature to ensure that these patterned layers are correctly registered to the conductive substrate and to each other. By having the alignment feature created during the etching process of the conductive conductor on the flexible support, there is no associated alignment error with this step. Since alignment errors propagate, this is a major advantage. In the case of pixilated displays, the alignment feature can be used to align the interconnects to the columns of the etched transparent conductor on the flexible support. As the pixels per inch of a matrix display increases, such conductive columns are increasingly narrow, making accurate placement of the interconnects more difficult. By eliminating the error in registration between the alignment feature and the etched columns, misalignment between the conductive columns and interconnects are greatly reduced.

A detection system has been developed that is capable of detecting etched alignment features on a transparent specular or opaque specular base web/support through the use of dark field illumination techniques. In a preferred embodiment, the visibility of the alignment feature is enhanced by altering the etching conditions to ablate or damage the flexible support base, thus creating a diffuse reflective surface.

Dark field illumination techniques are based on the ability to locally disrupt or modify the otherwise uniform specular reflection characteristic of a surface. Parallel rays, incident on a specular reflecting surface, emerge as parallel rays. That is, the angle of reflection is equal for all incident parallel rays on a specular reflective surface. Diffuse reflective surfaces, on the other hand, produces a variety of angles of reflection when parallel rays of incident light are reflected from the surface. Dark field illumination uses the uniform reflection characteristic of a specular reflecting surface by illuminating the surface with light bundles that are parallel or form the same angle to the surface normal and strike the surface at an oblique angle. The resulting scene, as imaged from directly above the incident point is dark due to the emerging rays being reflected at the same oblique angle as the incident angle. That is, no light is reflected at an angle normal to the surface, as is needed to arrive at a point directly above the incidence point.

Figure 2:
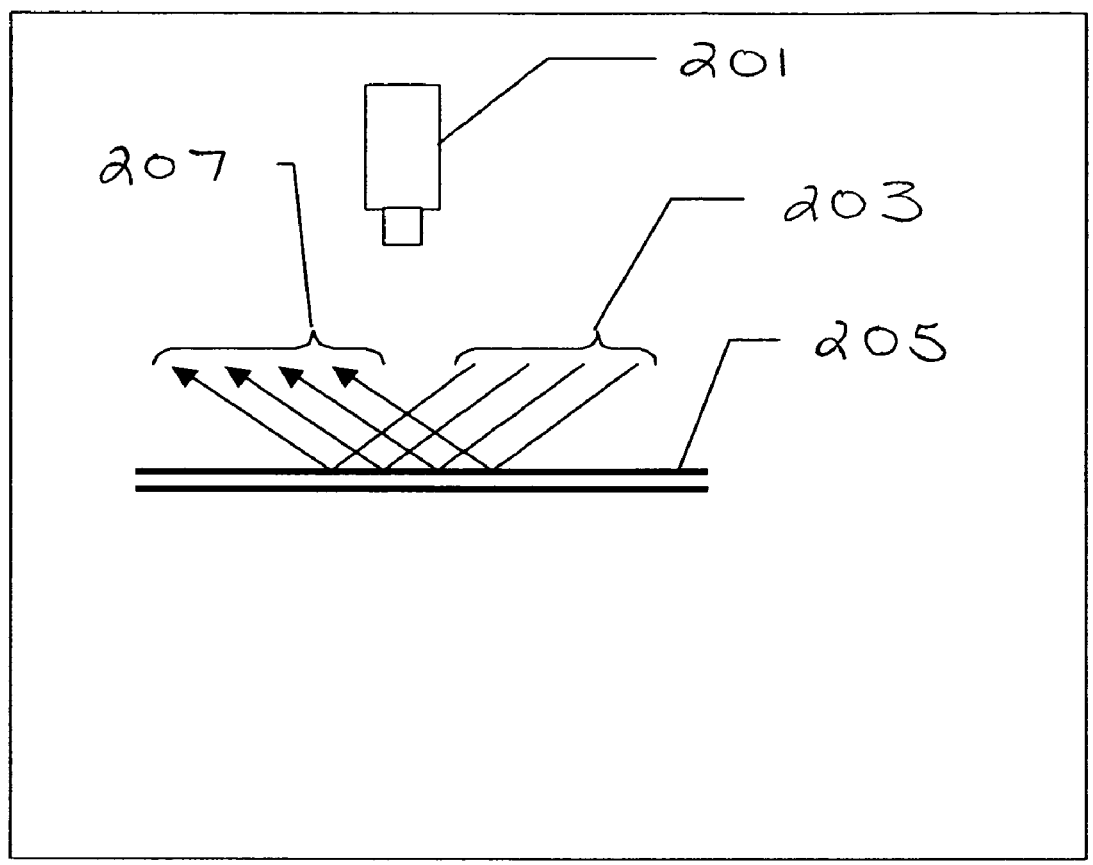
FIG. 2 is a cross section of specular surface region, including imaging camera location.

FIG. 2 shows a cross section of dark field illumination applied to a specular surface. In the case of a specular surface 205, incoming parallel light rays 203 are reflected from the surface as reflected parallel light rays 207. All light is reflected from the surface and away from solid state camera with lens 201. No light is reflected to camera 201, therefore the entire field perceived by the camera is dark.

Figure 3:
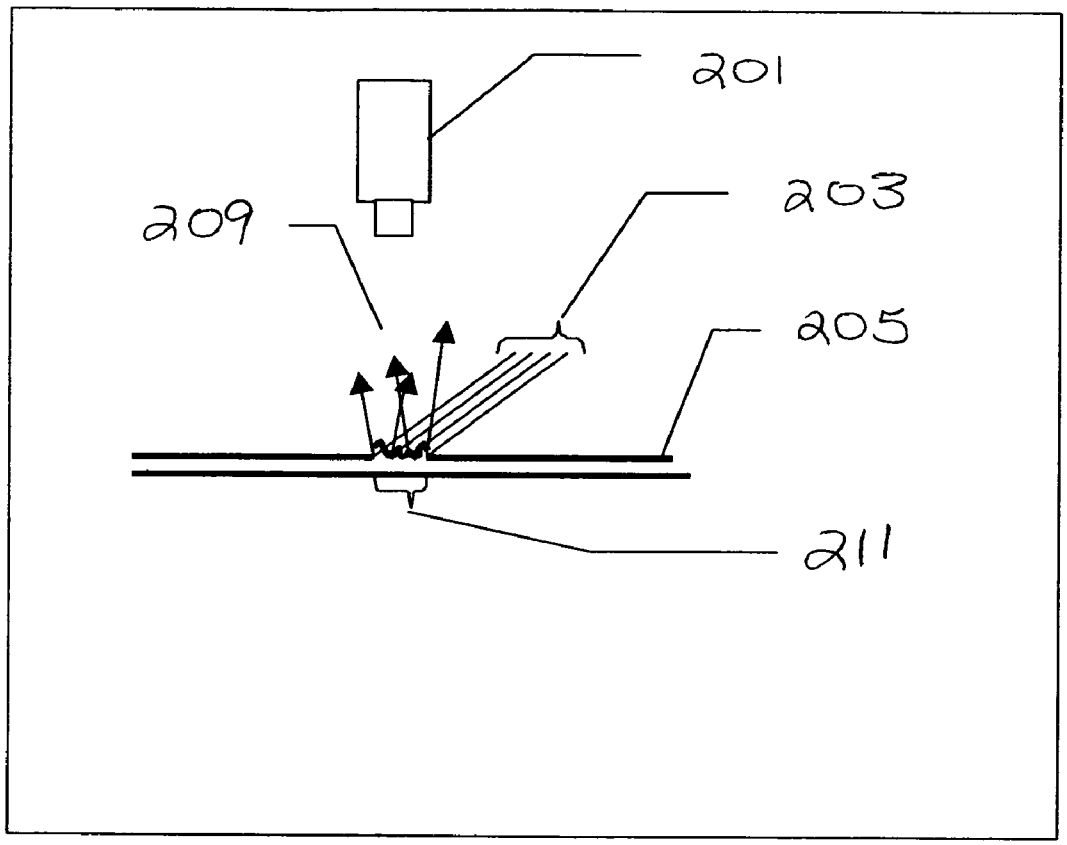
FIG. 3 is a cross section of non -specular surface region, including imaging camera location.

If, on the other hand, some portion of the specular surface 205 is modified to produce a scattering of the light rays, some portion of the reflected light will be directed normal to the surface and thus arrive at the image point. The portion of the image within the scene where the specular surface is modified to produce light scattering will appear brighter than the surrounding specular surface when imaged from above. This contrast between the specular reflecting, dark surround and the light scattering bright region makes it possible to create locating features that can be used to identify a specific location on the surface of the material. FIG. 3 shows a cross section of dark field illumination applied to a surface where a region of non-specular or scattering reflection is present. In the case of a specular surface 205 with a non-specular region of the surface 211, incoming parallel light rays 203 are reflected from the surface as at many different angles, producing scattered, reflected, non-parallel light rays 209. Although some of the light is reflected from the surface and away from solid state camera with lens 201, a portion of the scattered light rays reach camera 201. The scattered light rays reaching camera 201 are imaged by the camera, producing a brighter area above the incident point corresponding to non-specular region 211.

In practical terms, perfectly parallel light rays are not required to produce a dark field effect. More or less parallel rays that are incident at a very shallow angle on a specular surface will still be reflected away from a point directly above the point of incidence.

The preferred means for providing nearly parallel light rays that strike the base web/support at an oblique angle is to use a fiber optic cold light source configured as a ring light with a shallow exit angle. Other suitable means for providing oblique illumination include the following: use of a fiber optic cold light source configured as a line light, an array of light emitting diodes arranged to form a line, an array of light emitting diodes arranged to form a ring, a point source with a suitably located collimating optic or a laser arranged to strike the surface obliquely. The lighting used may include any type of lighting capable of providing oblique lighting, but is preferably visible lighting, ultraviolet lighting or infrared lighting.

The alignment feature is detected by an analysis system capable of sensing the scattered light of the alignment feature and referencing the alignment feature to a position on the support. The system may include a camera, lens, and a processor utilizing an algorithm to analyze the detected image and subsequently enable alignment of the next operation. Algorithms employed can include methods for distinguishing between alignments features and defects such as scratches, particulate matter, and the like. A region of the base web/support that includes the alignment feature can be imaged using a lens in combination with a camera. In particular, a solid-state camera that can be interfaced to a computer provides for the possibility of automated analysis of the scene. Analysis of the scene consists of segmentation of the scene content so that alignment features can be identified. Identification of the alignment features is desired to make estimates of the feature's location with respect to the acquiring camera's position. The reference mark's position provides information that can be used by subsequent processes to locate components or to direct equipment capable of producing further modifications to the base web/support.

In the circumstance where the base web/support is, to some greater or lesser degree, transparent, some of the incident light will be transmitted through the material. Some portion of the transmitted light will be reflected off other surfaces beneath the base web/support and imaged by the camera. This light will reduce the apparent contrast between the alignment feature and the dark surround. In order to minimize this contrast loss, a light trap or light dump can be configured that will redirect the light away from camera. A light dump consists of a specular reflecting surface that is arranged so that incident light is directed away from the imaging camera. Typically, a mirror is arranged with its surface at approximately a 45-degree angle to the camera lens's axis. The angle to the normal can be adjusted to produce the best effect based on the particulars of the scattering transmission through the specular reflecting surface.

Similarly, a light trap can be used to reduce the light that may be reflected back through the base web/support to the camera. A light trap is configured by arranging surfaces that are light absorbing beneath the camera. Performance of a light trap is enhanced by arranging the surfaces of the absorbing material to direct any light that is not absorbed towards another absorbing surface until the light energy has been reduced to a level insignificant to the imaging system.

The substrate, also referred to herein as the support, may be made of a flexible material, preferably a flexible polymeric material such as Kodak Estar film base formed of polyester plastic. Preferably, the thickness of the support is at least 3 microns, and more preferably, from 50 to 250 microns or approximately 2-10 mils. For example, the support may be an 80 microns thick sheet of transparent polyester. The thickness of the support and curable material layers may vary but are most preferably in the range from 60 to 300 microns, with the thickness of the curable layers in the range of from 10 to 70 microns.

The flexible plastic support may be any flexible self-supporting plastic film. "Plastic" means a high polymer, usually made from polymeric synthetic resins, which may be combined with other ingredients, such as curatives, fillers, reinforcing agents, colorants, and plasticizers. Plastic includes thermoplastic materials and thermosetting materials.

The flexible plastic film preferably has sufficient thickness and mechanical integrity so as to be self-supporting, yet may not be so thick as to be rigid. Typically, the flexible plastic support is the thickest layer of a composite film in thickness. Consequently, the support determines to a large extent the mechanical and thermal stability of the fully structured composite film.

Another significant characteristic of a flexible plastic support material is its glass transition temperature (Tg). Tg is defined as the glass transition temperature at which plastic material will change from the glassy state to the rubbery state. It comprises a range before the material may actually flow. Suitable materials for the flexible plastic support include thermoplastics of a relatively low glass transition temperature, for example up to 150° C., as well as materials of a higher glass transition temperature, for example, above 150° C. The choice of material for the flexible plastic support may depend on various factors, for example, manufacturing process conditions, such as deposition temperature, and annealing temperature, as well as those conditions encountered post-manufacturing, such as in a process line of a display manufacturer. Certain of the plastic supports discussed below can withstand higher processing temperatures of up to at least 200° C., some up to 300-350° C., without damage.

Typically, the flexible plastic support is polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl (x-methacrylates), an aliphatic or cyclic polyolefin, polyarylate (PAR), polyetherimide (PEI), polyethersulphone (PES), polyimide (PI), Teflon poly(perfluoro-alboxy) fluoropolymer (PFA), poly(ether ether ketone) (PEEK), poly(ether ketone) (PEK), poly(ethylene tetrafluoroethylene)fluoropolymer (PETFE), and poly (methyl methacrylate) and various acrylate/methacrylate copolymers (PMMA). Aliphatic polyolefins may include high density polyethylene (HDPE), low density polyethylene (LDPE), and polypropylene, including oriented polypropylene (OPP). Cyclic polyolefins may include poly(bis(cyclopentadiene)). A preferred flexible plastic support is a cyclic polyolefin or a polyester. Various cyclic polyolefins are suitable for the flexible plastic support. Examples include Arton® made by Japan Synthetic Rubber Co., Tokyo, Japan; Zeanor T made by Zeon Chemicals L.P., Tokyo Japan; and Topas® made by Celanese A. G., Kronberg Germany. Arton® is a poly(bis(cyclopentadiene)) condensate that is a film of a polymer. A preferred polyester is an aromatic polyester such as Arylite. Although various examples of plastic supports are set forth above, it may be appreciated that the support may also be formed from other materials such as glass and quartz, providing they are flexible.

The flexible plastic support may be reinforced with a hard coating. Typically, the hard coating is an acrylic coating. Such a hard coating typically has a thickness of from 1 to 15 microns, preferably from 2 to 4 microns and may be provided by free radical polymerization, initiated either thermally or by ultraviolet radiation, of an appropriate polymerizable material. Depending on the support, different hard coatings may be used. When the support is polyester or Arton®, a particularly preferred hard coating is the coating known as "Lintec." Lintec contains UV-cured polyester acrylate and colloidal silica. When deposited on Arton®, it has a surface composition of 35 atom % C, 45 atom % 0, and 20 atom % Si, excluding hydrogen. Another particularly preferred hard coating is the acrylic coating sold under the trademark "Terrapin" by Tekra Corporation, New Berlin, Wisc.

In the present invention, curable materials are applied to the support. The curable material may comprise any material that is curable and may be applied to form a coating. This may include materials that may require some chemical mechanism, such as crosslinking, to cure as well as evaporation of a carrier solvent. In one embodiment, the curable material may comprise a polymeric material. Coatings may include, but are not limited to, imageable layers, light modulating layers, conductive layers, color contrast layers, dielectric layers, and barrier layers. The curable material may be directly applied to the support or it may be applied with a carrier material that may be later removed to facilitate the curing process, such as a solvent.

The curable materials may be applied to the support by any method known by those of skill in the art to form a layer. Some exemplary methods may include screen printing, hopper coating, gravure printing, lithographic and photolithographic printing, spraying, and vapor depositing.

The curing process can occur by any means known to those of skill in the art of curing coatings, such as through application of light, heat, air flow, chemical reaction, or some other source of energy. Light activation of the curing process can occur through exposure to ultraviolet, visible, infrared light, or combinations thereof, which then initiates a chemical reaction to cure the materials, such as through cross-linking polymerizations.

The method of the present invention is preferably utilized in conjunction with the manufacture of a display device. In one embodiment, at least one imagable layer is applied to the support. The imageable layer can contain an electrically imageable material. The electrically imageable material can be light emitting or light modulating. Light emitting materials can be inorganic or organic in nature. Particularly preferred are organic light emitting diodes (OLED) or polymeric light emitting diodes (PLED). The light modulating material can be reflective or transmissive. Light modulating materials can be electrochemical, electrophoretic, such as Gyricon particles, electrochromic, or liquid crystals. The liquid crystalline material can be twisted nematic (TN), super-twisted nematic (STN), ferroelectric, magnetic, or chiral nematic liquid crystals. Especially preferred are chiral nematic liquid crystals. The chiral nematic liquid crystals can be polymer dispersed liquid crystals (PDLC). Structures having stacked imaging layers or multiple support layers, however, are optional for providing additional advantages in some case.

A suitable material may include electrically modulated material disposed on a suitable support structure, such as on or between one or more electrodes. The term "electrically modulated material" as used herein is intended to include any suitable non-volatile material. Suitable materials for the electrically modulated material are described in U.S. patent application Ser. No. 09/393,553 and U.S. Provisional Patent Application Ser. No. 60/099,888, the contents of both applications are herein incorporated by reference.

The electrically modulated material may also be a printable, conductive ink having an arrangement of particles or microscopic containers or microcapsules. Each microcapsule contains an electrophoretic composition of a fluid, such as a dielectric or emulsion fluid, and a suspension of colored or charged particles or colloidal material. The diameter of the microcapsules typically ranges from about 30 to about 300 microns. According to one practice, the particles visually contrast with the dielectric fluid. According to another example, the electrically modulated material may include rotatable balls that can rotate to expose a different colored surface area, and which can migrate between a forward viewing position and/or a rear non-viewing position, such as gyricon. Specifically, gyricon is a material comprised of twisting rotating elements contained in liquid-filled spherical cavities and embedded in an elastomer medium. The rotating elements may be made to exhibit changes in optical properties by the imposition of an external electric field. Upon application of an electric field of a given polarity, one segment of a rotating element rotates toward, and is visible by an observer of the display. Application of an electric field of opposite polarity, causes the element to rotate and expose a second, different segment to the observer. A gyricon display maintains a given configuration until an electric field is actively applied to the display assembly. Gyricon particles typically have a diameter of about 100 microns. Gyricon materials are disclosed in U.S. Pat. Nos. 6,147,791, 4,126,854 and 6,055,091, the contents of which are herein incorporated by reference.

According to one practice, the microcapsules may be filled with electrically charged white particles in a black or colored dye. Examples of electrically modulated material and methods of fabricating assemblies capable of controlling or effecting the orientation of the ink suitable for use with the present invention are set forth in International Patent Application Publication Number WO 98/41899, International Patent Application Publication Number WO 98/19208, International Patent Application Publication Number WO 98/03896, and International Patent Application Publication Number WO 98/41898, the contents of which are herein incorporated by reference.

The electrically modulated material may also include material disclosed in U.S. Pat. No. 6,025,896, the contents of which are incorporated herein by reference. This material comprises charged particles in a liquid dispersion medium encapsulated in a large number of microcapsules. The charged particles can have different types of color and charge polarity. For example, white positively charged particles can be employed along with black negatively charged particles. The described microcapsules are disposed between a pair of electrodes, such that a desired image is formed and displayed by the material by varying the dispersion state of the charged particles. The dispersion state of the charged particles is varied through a controlled electric field applied to the electrically modulated material. According to a preferred embodiment, the particle diameters of the microcapsules are between about 5 microns and about 200 microns, and the particle diameters of the charged particles are between about one-thousandth and one-fifth the size of the particle diameters of the microcapsules.

Further, the electrically modulated material may include a thermo-chromic material. A thermo-chromic material is capable of changing its state alternately between transparent and opaque upon the application of heat. In this manner, a thermo-chromic imaging material develops images through the application of heat at specific pixel locations in order to form an image. The thermo-chromic imaging material retains a particular image until heat is again applied to the material. Since the rewritable material is transparent, UV fluorescent printings, designs and patterns underneath can be seen through.

The electrically modulated material may also include surface stabilized ferroelectric liquid crystals (SSFLC). Surface stabilized ferroelectric liquid crystals confine ferroelectric liquid crystal material between closely-spaced glass plates to suppress the natural helix configuration of the crystals. The cells switch rapidly between two optically distinct, stable states simply by alternating the sign of an applied electric field.

Magnetic particles suspended in an emulsion comprise an additional imaging material suitable for use with the present invention. Application of a magnetic force alters pixels formed with the magnetic particles in order to create, update or change human and/or machine readable indicia. Those skilled in the art will recognize that a variety of bi-stable non-volatile imaging materials are available and may be implemented in the present invention.

The electrically modulated material may also be configured as a single color, such as black, white or clear, and may be fluorescent, iridescent, bioluminescent, incandescent, ultraviolet, infrared, or may include a wavelength specific radiation absorbing or emitting material. There may be multiple layers of electrically modulated material. Different layers or regions of the electrically modulated material display material may have different properties or colors. Moreover, the characteristics of the various layers may be different from each other. For example, one layer can be used to view or display information in the visible light range, while a second layer responds to or emits ultraviolet light. The non-visible layers may alternatively be constructed of non-electrically modulated material based materials that have the previously listed radiation absorbing or emitting characteristics. The electrically modulated material employed in connection with the present invention preferably has the characteristic that it does not require power to maintain display of indicia.

In a preferred embodiment, the electrically imageable material can be addressed with an electric field and then retain its image after the electric field is removed, a property typically referred to as "bistable". Particularly suitable electrically imageable materials that exhibit "bistability" are electrochemical, electrophoretic, such as Gyricon particles, electrochromic, magnetic, or chiral nematic liquid crystals. Especially preferred are chiral nematic liquid crystals. The chiral nematic liquid crystals can be polymer dispersed liquid crystals (PDLC).

Most preferred is a support bearing a conventional polymer dispersed light-modulating material. The liquid crystal (LC) is used as an optical switch. The supports are usually manufactured with transparent, conductive electrodes, in which electrical "driving" signals are coupled. The driving signals induce an electric field which can cause a phase change or state change in the LC material, the LC exhibiting different light-reflecting characteristics according to its phase and/or state.

Liquid crystals may be nematic (N), chiral nematic (N*), or smectic, depending upon the arrangement of the molecules in the mesophase. Chiral nematic liquid crystal refers to the type of liquid crystal having finer pitch than that of twisted nematic and super-twisted nematic. Chiral nematic liquid crystals are so named because such liquid crystal formulations are commonly obtained by adding chiral agents to host nematic liquid crystals. Chiral nematic liquid crystals may be used to provide bistable and multistable reflective displays that, due to their non-volatile "memory" characteristic, do not require a continuous driving circuit to maintain a display image, thereby significantly reducing power consumption. Chiral nematic displays are bistable in the absence of a field, the two stable textures being the reflective planar texture and the weakly scattering focal conic texture. In the planar texture, the helical axes of the chiral nematic liquid crystal molecules are substantially parallel to the support upon which the liquid crystal is disposed. In the focal conic, state the helical axes of the liquid crystal molecules are generally randomly oriented. By adjusting the concentration of chiral dopants in the chiral nematic material, the pitch length of the molecules and, thus, the wavelength of radiation that they will reflect, may be adjusted. Chiral nematic materials that reflect infrared radiation have been used for purposes of scientific study. Commercial displays are most often fabricated from chiral nematic materials that reflect visible light. Some known LCD devices include chemically-etched, transparent, conductive layers overlying a glass support as described in U.S. Pat. No. 5,667,853, incorporated herein by reference.

There are alternative display technologies to LCDs that may be used, for example, in flat panel displays. A notable example is organic or polymer light-emitting devices (OLEDs) or (PLEDs), which are comprised of several layers in which one of the layers is comprised of an organic material that can be made to electroluminesce by applying a voltage across the device. An OLED device is typically a laminate formed in a substrate such as glass or a plastic polymer. A light-emitting layer of a luminescent organic solid, as well as adjacent semiconductor layers, are sandwiched between an anode and a cathode. The semiconductor layers may be whole-injecting and electron-injecting layers. PLEDs may be considered a subspecies of OLEDs in which the luminescent organic material is a polymer. The light-emitting layers may be selected from any of a multitude of light-emitting organic solids, e.g., polymers that are suitably fluorescent or chemiluminescent organic compounds. Such compounds and polymers include metal ion salts of 8-hydroxyquinolate, trivalent metal quinolate complexes, trivalent metal bridged quinolate complexes, Schiff-based divalent metal complexes, tin (IV) metal complexes, metal acetylacetonate complexes, metal bidenate ligand complexes incorporating organic ligands, such as 2-picolylketones, 2-quinaldylketones, or 2-(o-phenoxy) pyridine ketones, bisphosphonates, divalent metal maleonitriledithiolate complexes, molecular charge transfer complexes, rare earth mixed chelates, (5-hydroxy) quinoxaline metal complexes, aluminum tris-quinolates, and polymers such as poly(p-phenylenevinylene), poly(dialkoxyphenylenevinylene), poly(thiophene), poly(fluorene), poly(phenylene), poly(phenylacetylene), poly(aniline), poly(3-alkylthiophene), poly(3-octylthiophene), and poly(N-vinylcarbazole). When a potential difference is applied across the cathode and anode, electrons from the electron-injecting layer and holes from the hole-injecting layer are injected into the light-emitting layer; they recombine, emitting light. OLEDs and PLEDs are described in the following United States patents, all of which are incorporated herein by this reference: U.S. Pat. No. 5,707,745 to Forrest et al., U.S. Pat. No. 5,721,160 to Forrest et al., U.S. Pat. No. 5,757,026 to Forrest et al., U.S. Pat. No. 5,834,893 to Bulovic et al., U.S. Pat. No. 5,861,219 to Thompson et al., U.S. Pat. No. 5,904,916 to Tang et al., U.S. Pat. No. 5,986,401 to Thompson et al., U.S. Pat. No. 5,998,803 to Forrest et al., U.S. Pat. No. 6,013,538 to Burrows et al., U.S. Pat. No. 6,046,543 to Bulovic et al., U.S. Pat. No. 6,048,573 to Tang et al., U.S. Pat. No. 6,048,630 to Burrows et al., U.S. Pat. No. 6,066,357 to Tang et al., U.S. Pat. No. 6,125,226 to Forrest et al., U.S. Pat. No. 6,137,223 to Hung et al., U.S. Pat. No. 6,242,115 to Thompson et al., and U.S. Pat. No. 6,274,980 to Burrows et al.

In a typical matrix-address light-emitting display device, numerous light-emitting devices are formed on a single support and arranged in groups in a regular grid pattern. Activation may be by rows and columns, or in an active matrix with individual cathode and anode paths. OLEDs are often manufactured by first depositing a transparent electrode on the support, and patterning the same into electrode portions. The organic layer(s) is then deposited over the transparent electrode. A metallic electrode may be formed over the electrode layers. For example, in U.S. Pat. No. 5,703,436 to Forrest et al., incorporated herein by reference, transparent indium tin oxide (ITO) is used as the whole-injecting electrode, and a Mg—Ag-ITO electrode layer is used for electron injection.

Modern chiral nematic liquid crystal materials usually include at least one nematic host combined with a chiral dopant. Suitable chiral nematic liquid crystal compositions preferably have a positive dielectric anisotropy and include chiral material in an amount effective to form focal conic and twisted planar textures. Chiral nematic liquid crystal materials are preferred because of their excellent reflective characteristics, bistability and gray scale memory. The chiral nematic liquid crystal is typically a mixture of nematic liquid crystal and chiral material in an amount sufficient to produce the desired pitch length.

Chiral nematic liquid crystal materials and cells, as well as polymer stabilized chiral nematic liquid crystals and cells, are well known in the art and described in, for example, U.S. Pat. No. 5,695,682, U.S. application Ser. No. 07/969,093, Ser. No. 08/057,662, Yang et al., Appl. Phys. Lett. 60(25) pp 3102-04 (1992), Yang et al., J. Appl. Phys. 76(2) pp 1331 (1994), published International Patent Application No. PCT/US92/09367, and published International Patent Application No. PCT/US92/03504, all of which are incorporated herein by reference.

Suitable commercial nematic liquid crystals include, for example, E7, E48, E44, E31, E80, TL202, TL203, TL204 and TL205 manufactured by E. Merck. The chiral nematic material may comprise, for example, one or more of the following materials obtained from Merck Ltd.: BL061, BL100, BL101, BL087, BL118, and BL036. Although nematic liquid crystals having positive dielectric anisotropy, and especially cyanobiphenyls, are preferred, virtually any nematic liquid crystal known in the art, including those having negative dielectric anisotropy, may be suitable for use with the invention. Chiral nematic liquid crystal materials may be Merck BL112, BL126, BL-03, BL-048 or BL-033, which are available from EM Industries of Hawthorne, N.Y. Other suitable materials may include ZLI-3308, ZLI-3273, ZLI-5048-000, ZLI-5049-100, ZLI-5100-100, ZLI-5800-000 and MLC-6041-100. Other light reflecting or diffusing modulating, electrically operated materials may also be coated, such as a microencapsulated electrophoretic material in oil. Examples of nematic hosts are mixtures containing 5CB or MBBA.

The present invention may employ, as a light-modulating layer, chiral-nematic liquid-crystal compositions dispersed in a continuous matrix. Such materials are referred to as "polymer-dispersed liquid crystal" materials or "PDLC" materials. Such materials may be made by a variety of methods. For example, Doane et al. (Applied Physics Letters 48, 269

(1986)) disclose a PDLC comprising approximately 0.4 μm droplets of nematic liquid crystal 5CB in a polymer binder. A phase separation method is used for preparing the PDLC. A solution containing monomer and liquid crystal is filled in a display cell and the material is then polymerized. Upon polymerization, the liquid crystal becomes immiscible and nucleates to form droplets. West et al. (Applied Physics Letters 63, 1471 (1993)) disclose a PDLC comprising a chiral nematic mixture in a polymer binder. Once again, a phase separation method is used for preparing the PDLC. The liquid-crystal material and polymer (a hydroxy functionalized polymethylmethacrylate) along with a cross-linker for the polymer are dissolved in a common organic solvent toluene and coated on an indium tin oxide (ITO) support. A dispersion of the liquid-crystal material in the polymer binder is formed upon evaporation of toluene at high temperature. The phase separation methods of Doane et al. and West et al. require the use of organic solvents that may be objectionable in certain manufacturing environments.

The liquid crystalline material may be made by methods known to those of skill in the art, such as an emulsification method or a phase separation method. In a preferred embodiment, the liquid crystalline material may be fabricated using limited coalescence processing to form uniformly sized emulsions of liquid crystalline material. Such methods are disclosed in U. S. patent application Ser. No. 10/095,379 to Stephenson, filed Mar. 12, 2002, titled "A Method Of Making A Coated Polymer-Dispersed Electro-Optical Fluid And Sheets Formed Thereby, hereby incorporated by reference in its entirety. This may be done by homogenizing the liquid crystalline material in the presence of finely divided silica, a coalescence limiting material, such as LUDOX from Dupont Corporation. A promoter material may be added to the aqueous bath to drive the colloidal particles to the liquid-liquid interface. In a preferred embodiment, a copolymer of adipic acid and 2-(methylamino) ethanol may be used as the promoting agent in the water bath. The liquid crystal material may be dispersed using ultrasound to create liquid crystal domains below 1 micron in size. When the ultrasound energy is removed, the liquid crystal material coalesces into domains of uniform size. The ratio of smallest to largest domain size preferably varies by approximately 1:2. By varying the amount of silica and copolymer relative to the liquid crystalline material, uniform domain size emulsions of average diameters of approximately 1, 3, and, 8 microns may be produced, as determined by microscopy. These emulsions may be diluted in gelatin solution for subsequent coating.

Preferably, the domains are flattened spheres and have on average a thickness substantially less than their length, preferably at least 50% less. More preferably, the domains on average have a thickness (depth) to length ratio of 1:2 to 1:6. The flattening of the domains may be achieved by proper formulation and sufficiently rapid drying of the coating. The domains preferably have an average diameter of 2 to 30 microns. The imaging layer preferably has a thickness of 10 to 150 microns when first coated and 2 to 20 microns when dried.

The flattened domains of liquid crystal material may be defined as having a major axis and a minor axis. In a preferred embodiment of a display or display sheet, the major axis is larger in size than the cell (or imaging layer) thickness for a majority of the domains. Such a dimensional relationship is shown in U.S. Pat. No. 6,061,107, hereby incorporated by reference in its entirety.

In a preferred embodiment, the contrast of the display is maximized by the use of only a substantial monolayer of N*LC domains. The term "substantial monolayer" is defined herein to mean that, in a direction perpendicular to the plane of the display, there is no more than a single layer of domains sandwiched between the electrodes at most points of the display (or the imaging layer), preferably at 75 percent or more of the points (or area) of the display, most preferably at 90 percent or more of the points (or area) of the display. In other words, at most, only a minor portion (preferably less than 10 percent) of the points (or area) of the display has more than a single domain (two or more domains) between the electrodes in a direction perpendicular to the plane of the display, compared to the amount of points (or area) of the display at which there is only a single domain between the electrodes.

The amount of material needed for a monolayer can be accurately determined by calculation based on individual domain size, assuming a fully closed packed arrangement of domains. In practice, there may be imperfections in which gaps occur and some unevenness due to overlapping droplets or domains. On this basis, the calculated amount is preferably less than about 150 percent of the amount needed for monolayer domain coverage, preferably not more than about 125 percent of the amount needed for a monolayer domain coverage, more preferably not more than 110 percent of the amount needed for a monolayer of domains. Furthermore, improved viewing angle and broadband features may be obtained by appropriate choice of differently doped domains based on the geometry of the coated droplet and the Bragg reflection condition.

The liquid crystalline layer or layers may also contain other ingredients. For example, while color is introduced by the liquid crystal material itself, pleochroic dyes may be added to intensify or vary the color reflected by the cell. Similarly, additives such as fumed silica may be dissolved in the liquid crystal mixture to adjust the stability of the various chiral nematic textures. A dye in an amount ranging from about 0.25% to about 1.5% may also be used.

The display contains at least one conductive layer, which typically is comprised of a primary metal oxide. This conductive layer may comprise other metal oxides such as indium oxide, titanium dioxide, cadmium oxide, gallium indium oxide, niobium pentoxide and tin dioxide. See, Int. Publ. No. WO 99/36261 by Polaroid Corporation. In addition to the primary oxide such as ITO, the at least one conductive layer may also comprise a secondary metal oxide such as an oxide of cerium, titanium, zirconium, hafnium and/or tantalum. See, U.S. Pat. No. 5,667,853 to Fukuyoshi et al. (Toppan Printing Co.) Other transparent conductive oxides include, but are not limited to $ZnO_2$, $Zn_2SnO_4$, $Cd_2SnO_4$, $Zn_2In_2O_5$, $MgIn_2O_4$, $Ga_2O_3$—$In_2O_3$, or $TaO_3$. The conductive layer may be formed, for example, by a low temperature sputtering technique or by a direct current sputtering technique, such as DC-sputtering or RF-DC sputtering, depending upon the material or materials of the underlying layer. The conductive layer may be a transparent, electrically conductive layer of tin-oxide or indium-tin-oxide (ITO), or polythiophene. Typically, the conductive layer is sputtered onto the support to a resistance of less than 500 ohms per square. Alternatively, the conductive layer may be an opaque electrical conductor formed of metal such as copper, aluminum or nickel. If the conductive layer is an opaque metal, the metal may be a metal oxide to create a light absorbing conductive layer.

Indium tin oxide (ITO) is the preferred conductive material, as it is a cost effective conductor with good environmental stability, up to 90% transmission, and down to 20 ohms per square resistivity. An exemplary preferred ITO layer has a transmittance, % T, greater than or equal to 80% in the visible region of light, that is, from greater than 400 nm to 700 nm, so that the film will be useful for display applications. In a preferred embodiment, the conductive layer comprises a layer of low temperature ITO, which is polycrystalline. The ITO layer is preferably 10-120 nm in thickness,. An exemplary preferred ITO layer has a resistivity of 100 to 300 ohms/square.

For higher conductivities, the conductive layer may comprise a silver-based layer which contains silver only or silver containing a different element such as aluminum (Al), copper (Cu), nickel (Ni), cadmium (Cd), gold (Au), zinc (Zn), magnesium (Mg), tin (Sn), indium (In), tantalum (Ta), titanium (Ti), zirconium (Zr), cerium (Ce), silicon (Si), lead (Pb) or palladium (Pd). In a preferred embodiment, the conductive layer comprises at least one of gold, silver and a gold/silver alloy, for example, a layer of silver coated on one or both sides with a thinner layer of gold. See, Int. Publ. No. WO 99/36261 by Polaroid Corporation. In another embodiment, the conductive layer may comprise a layer of silver alloy, for example, a layer of silver coated on one or both sides with a layer of indium cerium oxide (InCeO). See U.S. Pat. No. 5,667,853, incorporated herein in by reference.

The conductive layer may be formed in a vacuum environment using materials such as aluminum, tin, silver, platinum, carbon, tungsten, molybdenum, or indium. Oxides of these metals may be used to darken patternable conductive layers. The metal material may be excited by energy from resistance heating, cathodic arc, electron beam, sputtering or magnetron excitation. There may also be more than one conductive layer.

The conductive layer is preferably patterned. The conductive layer is preferably patterned into a plurality of electrodes. The patterned electrodes may be used to form a LCD device. In another embodiment, two conductive substrates are positioned facing each other and chiral nematic liquid crystals are positioned therebetween to form a device. The patterned ITO conductive layer may have a variety of dimensions. Exemplary dimensions may include line widths of 10 microns, distances between lines, that is, electrode widths, of 200 microns, depth of cut, that is, thickness of ITO conductor, of 100 nanometers. ITO thicknesses on the order of 60, 70, and greater than 100 nanometers are also possible.

The conductive layer may be patterned by irradiating the multilayered conductor structure with ultraviolet radiation so that portions of the conductive layer are ablated therefrom. It is also known to employ an infra-red (IR) fiber laser for patterning a metallic conductive layer overlying a plastic film, directly ablating the conductive layer by scanning a pattern over the conductor/film structure. See: Int. Publ. No. WO 99/36261 and "42.2: A New Conductor Structure for Plastic LCD Applications Utilizing 'All Dry' Digital Laser Patterning," 1998 SID International Symposium Digest of Technical Papers, Anaheim, Calif., May 17-22, 1998, no. VOL. 29, May 17, 1998, pages 1099-1101, both incorporated herein by reference. The layer may also be patterned via chemical etching.

The LCD may also comprise at least one "functional layer" between the conductive layer and the support. The functional layer may comprise a protective layer or a barrier layer. The protective layer useful in the practice of the invention can be applied in any of a number of well known techniques, such as dip coating, rod coating, blade coating, air knife coating, gravure coating and reverse roll coating, extrusion coating, slide coating, curtain coating, and the like. The liquid crystal particles and the binder are preferably mixed together in a liquid medium to form a coating composition. The liquid medium may be a medium such as water or other aqueous solutions in which the hydrophilic colloid are dispersed with or without the presence of surfactants. A preferred barrier layer may acts as a gas barrier or a moisture barrier and may comprise SiOx, AlOx or ITO. The protective layer, for example, an acrylic hard coat, functions to prevent laser light from penetrating to functional layers between the protective layer and the support, thereby protecting both the barrier layer and the support. The functional layer may also serve as an adhesion promoter of the conductive layer to the support.

In another embodiment, the polymeric support may further comprise an antistatic functional layer to manage unwanted charge build up on the sheet or web/support during roll conveyance or sheet finishing. In another embodiment of this invention, the antistatic layer has a surface resistivity of between $10^5$ to $10^{12}$. Above $10^{12}$, the antistatic layer typically does not provide sufficient conduction of charge to prevent charge accumulation to the point of preventing fog in photographic systems or from unwanted point switching in liquid crystal displays. While layers greater than $10^5$ will prevent charge buildup, most antistatic materials are inherently not that conductive and in those materials that are more conductive than $10^5$, there is usually some color associated with them that will reduce the overall transmission properties of the display. The antistatic layer is separate from the highly conductive layer of ITO and provides the best static control when it is on the opposite side of the web/substrate/support from that of the ITO layer. This may include the web substrate itself.

Another type of functional layer may be a color contrast layer. Color contrast layers may be radiation reflective layers or radiation absorbing layers. In some cases, the rearmost surface of each display may preferably be painted black. The color contrast layer may also be other colors. In another embodiment, the dark layer comprises milled nonconductive pigments. The materials are milled below 1 micron to form "nano-pigments". In a preferred embodiment, the dark layer absorbs all wavelengths of light across the visible light spectrum, that is from 400 nanometers to 700 nanometers wavelength. The dark layer may also contain a set or multiple pigment dispersions. Suitable pigments used in the color contrast layer may be any colored materials, which are practically insoluble in the medium in which they are incorporated. Suitable pigments include those described in Industrial Organic Pigments: Production, Properties, Applications by W. Herbst and K. Hunger, 1993, Wiley Publishers. These include, but are not limited to, Azo Pigments such as monoazo yellow and orange, diazo, naphthol, naphthol reds, azo lakes, benzimidazolone, diazo condensation, metal complex, isoindolinone and isoindolinic, polycyclic pigments such as phthalocyanine, quinacridone, perylene, perinone, diketopyrrolopyrrole, and thioindigo, and anthriquinone pigments such as anthrapyrimidine.

The functional layer may be a dielectric material. A dielectric layer, for purposes of the present invention, is a layer that is not conductive or blocks the flow of electricity. This dielectric material may include a UV curable, thermoplastic, screen printable material, such as Electrodag 25208 dielectric coating from Acheson Corporation. The dielectric material forms a dielectric layer. This layer may include openings to define image areas, which are coincident with the openings. Since the image is viewed through a transparent substrate, the indicia are mirror imaged.

The dielectric material may form an adhesive layer to subsequently bond a second electrode to the light modulating layer. Conventional lamination techniques involving heat and pressure are employed to achieve a permanent durable bond. Certain thermoplastic polyesters, such as VITEL 1200 and 3200 resins from Bostik Corp., polyurethanes, such as MORTHANE CA-100 from Morton International, polyamides, such as UNIREZ 2215 from Union Camp Corp., polyvinyl butyral, such as BUTVAR B-76 from Monsanto, and poly(butyl methacrylate), such as ELVACITE 2044 from ICI Acrylics Inc. may also provide a substantial bond between the electrically conductive and light-modulating layers.

The dielectric adhesive layer may be coated from common organic solvents at a dry thickness of one to three microns. The dielectric adhesive layer may also be coated from an aqueous solution or dispersion. Polyvinyl alcohol, such as AIRVOL 425 or MM-51 from Air Products, poly(acrylic acid), and poly(methyl vinyl ether/maleic anhydride), such as GANTREZ AN-119 from GAF Corp. can be dissolved in water, subsequently coated over the second electrode, dried to a thickness of one to three microns and laminated to the light-modulating layer. Aqueous dispersions of certain polyamides, such as MICROMID 142LTL from Arizona Chemical, polyesters, such as AQ 29D from Eastman Chemical Products Inc., styrene/butadiene copolymers, such as TYLAC 68219-00 from Reichhold Chemicals, and acrylic/styrene copolymers such as RayTech 49 and RayKote 234L from Specialty Polymers Inc. can also be utilized as a dielectric adhesive layer as previously described.

The typical curing process takes place in several steps: (a) initiation, (b) machine conveyance curing, and (c) wound roll curing. There are two primary methods to cure the coatings: actinic and thermal. In actinic curing, polymerization of pre-polymeric inks with less than 10% volatiles is initiated by the application of electromagnetic energy. UV wavelengths at less than 386 nanometers are used for this process. Dosage limits are 100 to 1,000 mJ/cm$^2$ with 300 to 700 mJ/cm$^2$ preferred. Temperature and air flow are standard for one skilled in the art. Depending on dosage and spectra, UV curing may not be complete, requiring additional time to fully complete the curing process. Temperature limits may be 10 to 100° C. with 20 to 30° C. preferred. Humidity limits may be 0 to 90% with 40 to 60% preferred.

Thermally curable solvent coatings rely on diffusion and convection to drive off volatiles that can be up to 75% of the total coating. Initiation and conveyance curing take place by the application of elevated temperature gas moving along or across the web/support. Air dryer technology is well known and standard practices exist for these processes. In the conventional wound roll, drying does not usually continue. Temperature limits are 20 to 100° C. with 70 to 90° C. preferred, and humidity limits are 20 to 60% with 30 to 50% preferred.

In a preferred embodiment, the present invention is used to produce a liquid crystalline display. For example in liquid crystalline mixtures that are used in selectively reflecting chiral nematic displays, the pitch has to be selected such that the maximum of the wavelength reflected by the chiral nematic helix is in the range of visible light. Another possible application is polymer films with a chiral liquid crystalline phase for optical elements, such as chiral nematic broadband polarizers or chiral liquid crystalline retardation films. Among these are active and passive optical elements or color filters and liquid crystal displays, for example STN, TN, AMD-TN, temperature compensation, polymer free or polymer stabilized chiral nematic texture (PFCT, PSCT) displays. Possible display industry applications include ultralight, flexible, and inexpensive displays for notebook and desktop computers, instrument panels, video game machines, videophones, mobile phones, hand-held PCs, PDAs, e-books, camcorders, satellite navigation systems, store and supermarket pricing systems, highway signs, informational displays, smart cards, toys, and other electronic devices. The present invention may also be used in the production of other products, for example, sensors, medical test films, solar cells, fuel cells, to name a few.

Figure 4:
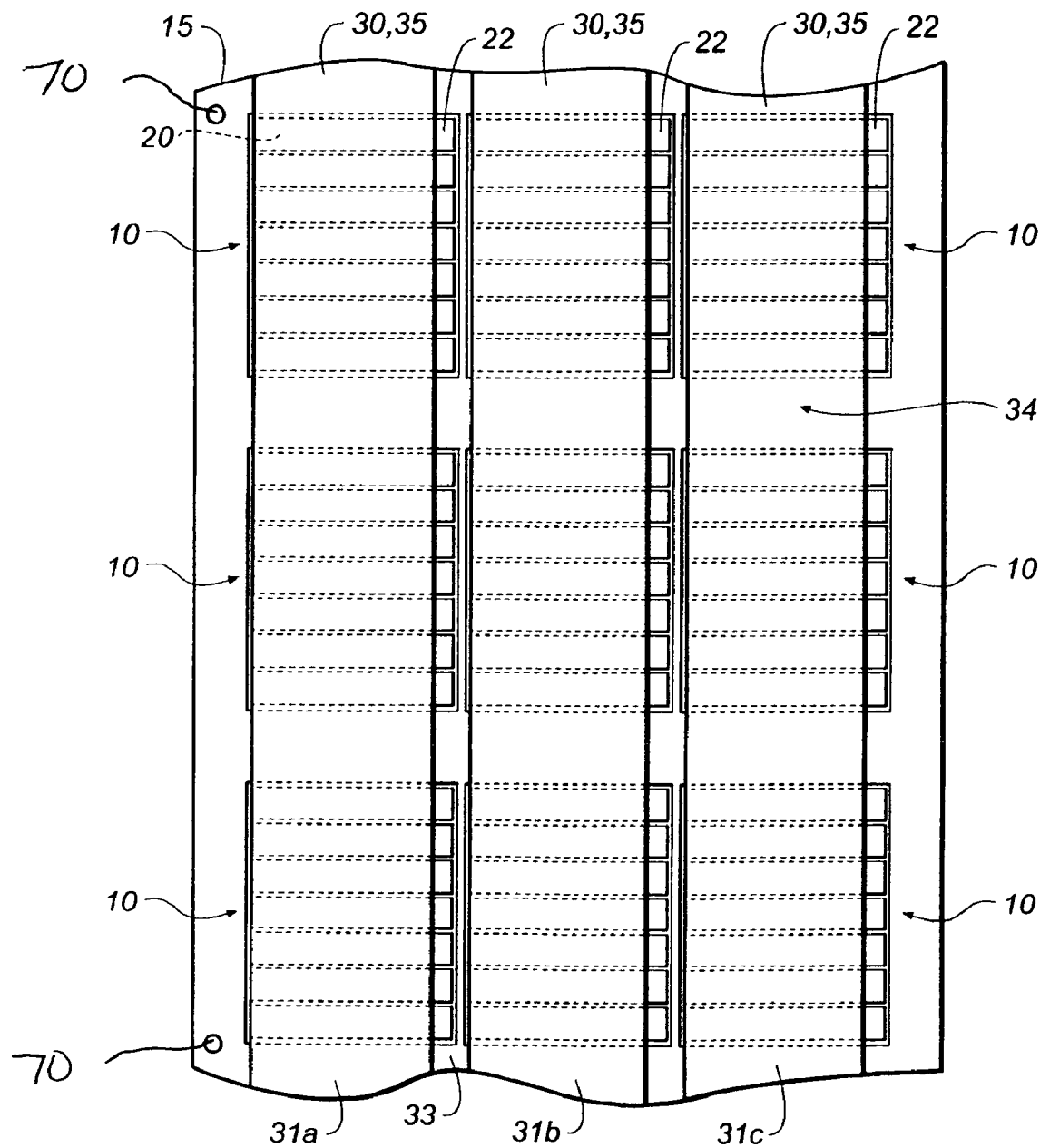
FIG. 4 is a rear view of a sheet made in accordance with the present invention during the manufacture of a segmented display showing a patterned first conductor.

FIG. 4 is a rear view of a sheet in accordance with the one embodiment of the present invention, which sheet has a plurality of patterned first conductors 20 provided on a flexible substrate 15. Shown are several partially completed display elements 10 (i.e., manufacturing intermediates for display elements 10). A set (or plurality) of first conductors in the form of individual segments are typically formed, for example, rectangular in shape, each segment corresponding, for example, to an alphanumeric character or other indicia or picture element as desired. These first conductors and alignment features 70 formed in the same manufacturing step, such as during laser etching. As shown, the sets of first conductors 20 for each individual display element 10 are arranged in series along each coated stripe layer of cholesteric material. In accordance with one embodiment of the invention, polymer-dispersed cholesteric material in striped layers 31a, 31b, 31c is selectively deposited over the sets of first conductors 20 in a manner that leaves portions 22 of each of the first conductors 20 in the set of first conductors exposed for each display element 10. The method permits roll-to-roll manufacture of display elements on a common flexible substrate 15 with minimal waste of deposited polymer-dispersed cholesteric layer 30. The exposed transparent first conductors 22 can be seen in the uncoated longitudinal space 33. This uncoated space allows (as shown later), in the completed display, electrical connection with contacts to a driver for the display that may be coupled or uncoupled to the display. The width of the exposed first conductors 22 in the space 33 can vary, and may even essentially fill the entire space. It will be noted that a leader space 34 may exist between display elements, the length of which can also vary, preferably shortened to reduce waste during later singulation of the display elements.

The display elements 10 can be arrayed as shown in FIG. 4 or there can be any number of rows (and corresponding stripes and longitudinal spaces) on a flexible substrate in the form of a moving web. Alternatively, a non-continuous common flexible substrate 15 in the form of a separate sheet of any length short of a web and having an array, or plurality, of display elements 10 can be transported, for example by means of a conveyer belt.

The striped coating of FIG. 4 can optionally be singulated into sheets at this stage, as mentioned above, and additional layers can be applied on the sheets. Second conductors are applied over the cholesteric layer and dark layer.

Figure 5:
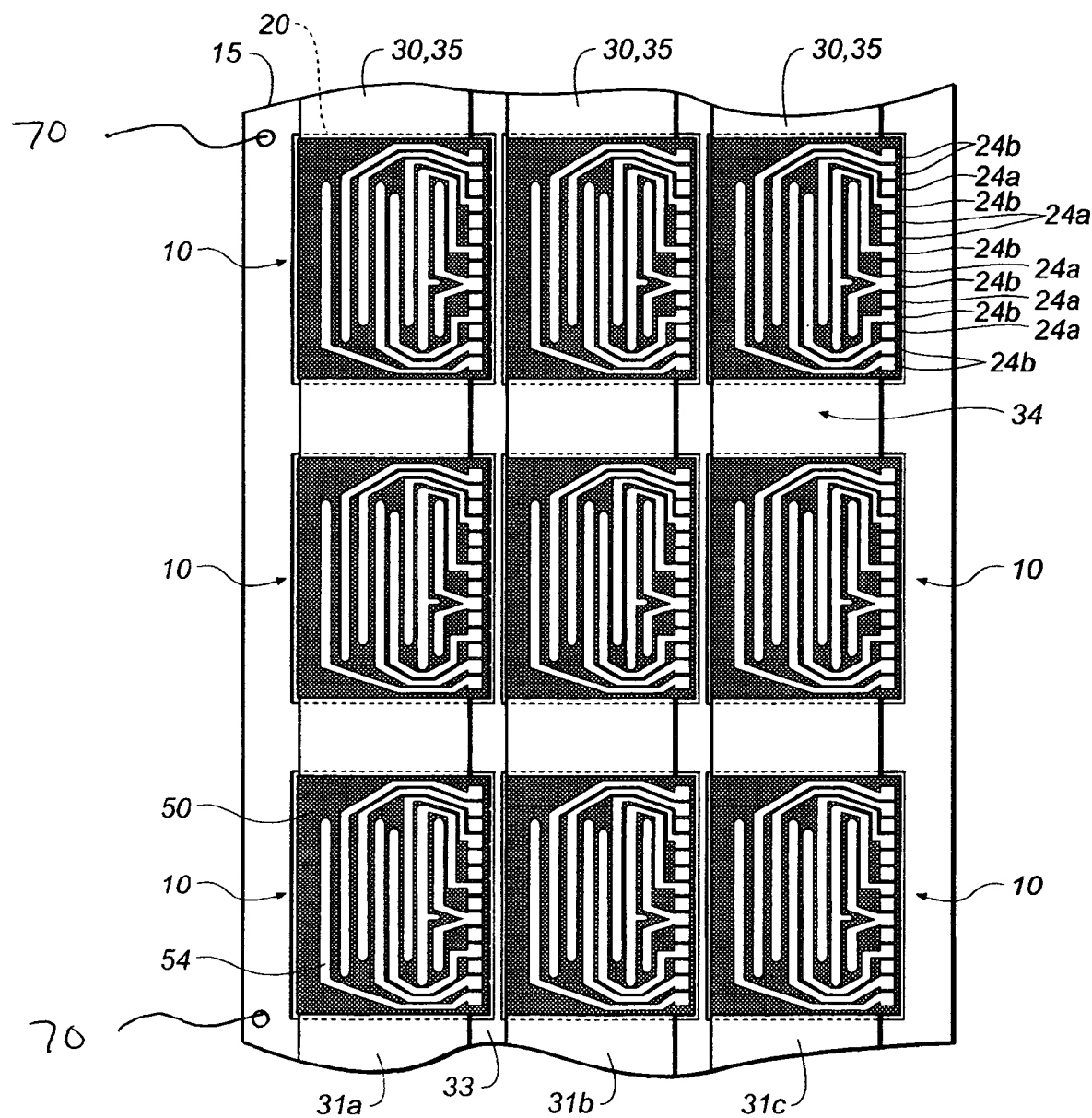
FIG. 5 is a top plan view of the display sheet of FIG. 7 after application of third conductors or traces in accordance with the one embodiment of the present invention.

FIG. 5 is a plan view of a display element or sheet (still a manufacturing intermediate for a display) in accordance with the present method invention after the application of third conductors over the dielectric layer. FIG. 5 shows flexible substrate 15, individual display elements 10, coated stripes 31a, 31b, 31c and inter-stripe gaps or spaces 33, in which are conductive contacts 24a, 24b. Conductive contacts 24a provide electrical connection with exposed first conductors 22. Conductive contacts 24b provide electrical connection to second conductors via the third conductors 54). The stripes include cholesteric layer 30 and dark layer 35, for example comprising a nanopigment, over which dark layer 35 is coated the dielectric layer 50.

Conductive traces 54 are printed to connect common second conductors using through vias 52 (shown in FIG. 7) in dielectric layer 50. The conductive traces or third conductors 54 form a predesigned path leading to conductive contacts 24a, 24b for a display driver, in the longitudinal spaces 33. A leader space 34 may exist between display elements 10, the length of which can also vary, preferably shortened to reduce waste during later singulation of the display elements. Especially in the case where the dielectric is patterned, instead of using via holes 25, to expose the first conductors in the inter-stripe longitudinal space, the conductive contacts 24a can be viewed as protective pads on the exposed portions of transparent conductors 22, which transparent conductors 22 are typically made of ITO which can be subject to undesirable scratching. In the embodiment shown in the present invention, the conductive contacts, for connection to a display driver, are advantageously all in the longitudinal space along the side of the display characters, thereby obviating the need for removing a portion of the imaging layer or other layers that have been coated over the first conductors in order to allow contact with the first conductors. Alignment features 70 in the transparent conductor layer are used according to the method of the invention to align first conductors with respect to the subsequent operations used for application of the second conductors, dielectric layers with via holes, third conductors, and conductive contacts.

Figure 6:
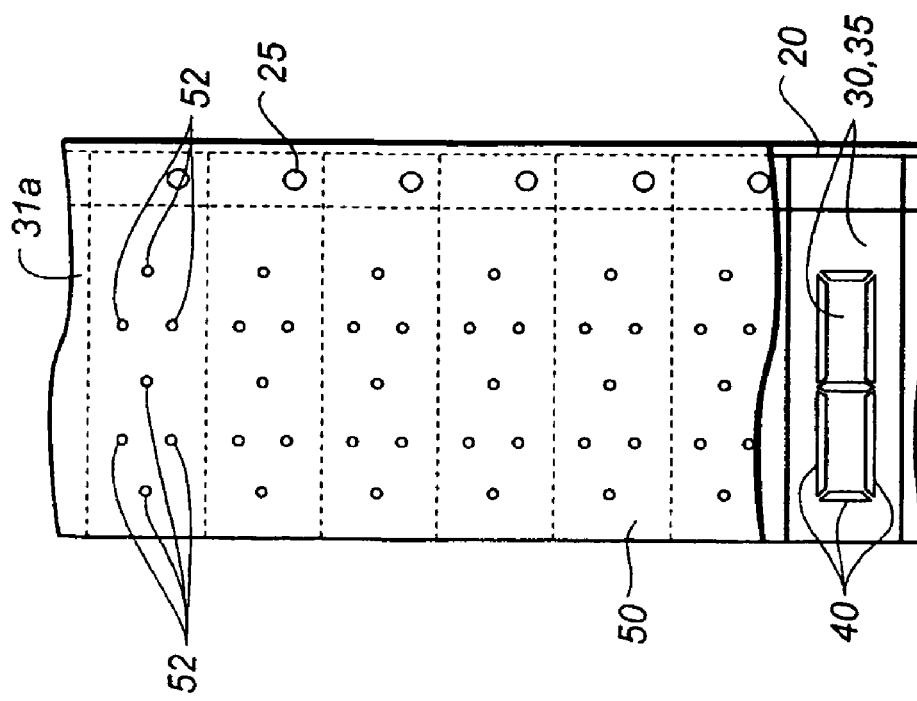
FIG. 6 is a rear view of a display in which second conductors and a dielectric layer are shown during the manufacture of the segmented display.

FIGS. 6 (front view) and 7 (rear view) illustrate more than one stage of the method, in which second conductors 40 have been printed over dark layer 35. FIG. 6 also shows a dielectric layer 50 that is printed over the second electrodes and the creation of via holes 52 to allow electrical connection to the second electrodes 40. Other via holes 25 in the dielectric, in the inter-stripe longitudinal space, can be made to connect to the first electrodes. The skilled artisan will understand that other ways to allow for electrical connection, to the first and second conductors, in the inter-stripe longitudinal space can be designed. For example, the dielectric layer can be patterned in the inter-stripe longitudinal space, for example to form isolation pads, such that via holes 25 are not needed. The via holes may be any shape, but are preferably either circular or rectangular. Still another alternative is to pattern the exposed first conductors 22 such that a portion of the ITO is removed where conductive contacts for the second electrodes are placed, so that the top and bottom electrodes are electrically isolated.

Figure 7:
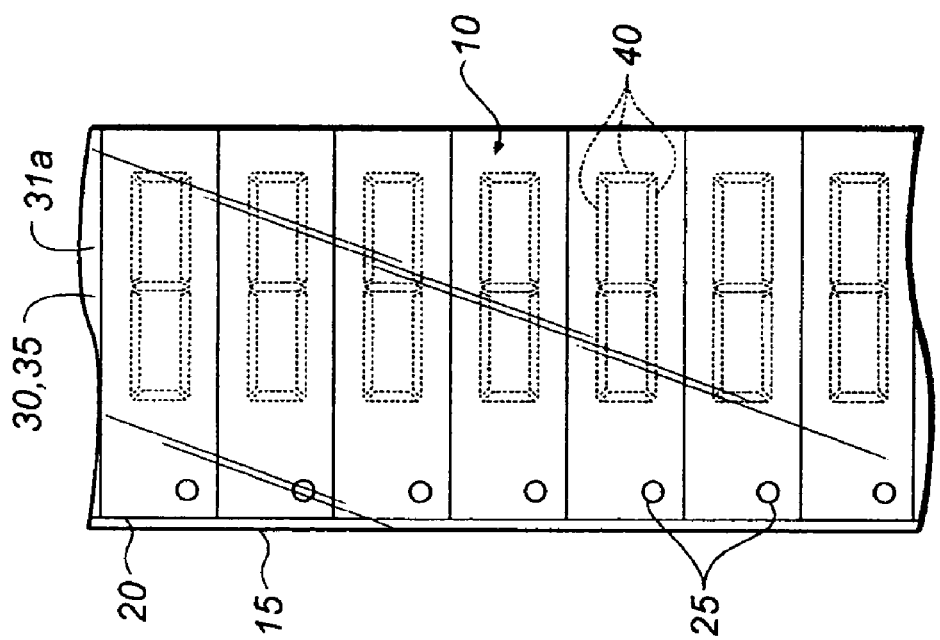
FIG. 7 is a front view of the segmented display of FIG. 5 in accordance with the method of the present invention as seen through the transparent support.

FIG. 7 is a front view of the display 10 in accordance with the present invention, as seen through the transparent support 15, in which the second electrodes 40 are shown under the striped layer 31a. The via holes 25 in the applied dielectric layer 50 permit access to the first conductors 20. Dielectric layer 50 covers second conductors 40, and the through-via 52 permits access to second conductors 40.

The through-via 52 can permit connection to segmented second conductors 40 to permit writing of cholesteric liquid crystal material to either the focal-conic or planar state during display use. Design of multiple printed layers to create a matrix driven seven-segment display having electrically writable inter-segment material are incorporated in co-pending U.S. application Ser. No. 10/426,539, which application is hereby incorporated by reference in its entirety.

Instead of coating a dielectric layer, air may be used as a dielectric material in combination with suitable spacing achieved by contacts.

A completed display assembly in accordance with the present invention can be connected to an electric driver via driver contacts (for both the first and second conductors) to conductive contacts 24a, 24b, which is connected to conductive traces 54 in FIG. 5. The driver can be connected by driver contacts to the conductors through protective covers or pads, as mentioned above. Electrical signals can be applied to the driver to write images onto the display. Segments of the display are typically written into the darker, focal-conic state to present image data. Writing data segments back into the electrically written planar state merges the previously written area into an optically continuous background.

In use, a display can, for example, comprise a circuit board attached to the assembly made. Contacts on the circuit board can provide electrical connection to each second conductor and first conductor via contacts in the uncoated space adjacent the striped material, the overall assembly of which will be understood by the skilled artisan.

In another embodiment, the method of the invention can be applied to the manufacture of printed articles, such as thermal transfer dye donor elements. The dye-donor element can include a dye-donor layer. The dye-donor layer can include one or more colored areas (patches) containing dyes suitable for thermal printing. As used herein, a "dye" can be one or more dye, pigment, colorant, or a combination thereof, and can optionally be in a binder or carrier as known to practitioners in the art. During thermal printing, at least a portion of one or more colored areas can be imagewise or patch transferred to the receiver element, forming a colored image on the receiver element. The dye-donor layer can include a laminate area (patch) having no dye. The laminate area can follow one or more colored areas. During thermal printing, the entire laminate area can be transferred to the receiver element. The dye-donor layer can include one or more colored areas and one or more laminate areas. For example, the dye-donor layer can include three color patches, for example, yellow, magenta, and cyan, and a clear laminate patch, for forming a full color image with a protective laminate layer on a receiver element.

Any dye transferable by heat can be used in the dye-donor layer of the dye-donor element. The dye can be selected by taking into consideration hue, lightfastness, and solubility of the dye in the dye donor layer binder and the dye image receiving layer binder. Examples of suitable dyes can include, but are not limited to, diarylmethane dyes; triarylmethane dyes; thiazole dyes, such as 5-arylisothiazole azo dyes; methine dyes such as merocyanine dyes, for example, aminopyrazolone merocyanine dyes; azomethine dyes such as indoaniline, acetophenoneazomethine, pyrazoloazomethine, imidazoleazomethine, imidazoazomethine, pyridoneazomethine, and tricyanopropene azomethine dyes; xanthene dyes; oxazine dyes; cyanomethylene dyes such as dicyanostyrene and tricyanostyrene dyes; thiazine dyes; azine dyes; acridine dyes; azo dyes such as benzeneazo, pyridoneazo, thiopheneazo, isothiazoleazo, pyrroleazo, pyrraleazo, imidazoleazo, thiadiazoleazo, triazoleazo, and disazo dyes; arylidene dyes such as alpha-cyano arylidene pyrazolone and aminopyrazolone arylidene dyes; spiropyran dyes; indolinospiropyran dyes; fluoran dyes; rhodaminelactam dyes; naphthoquinone dyes, such as 2-carbamoyl-4-[N-(p-substituted aminoaryl) imino]-1,4-naphthaquinone; anthraquinone dyes; and quinophthalone dyes. Specific examples of dyes usable herein can include:

C.I. (color index) Disperse Yellow 51, 3, 54, 79, 60, 23, 7, and 141;

C.I. Disperse Blue 24, 56, 14, 301, 334, 165, 19, 72, 87, 287, 154, 26, and 354;

C.I. Disperse Red 135, 146, 59, 1, 73, 60, and 167;

C.I. Disperse Orange 149;

C.I. Disperse Violet 4, 13, 26, 36, 56, and 31;

C.I. Disperse Yellow 56, 14, 16, 29, 201 and 231;

C.I. Solvent Blue 70, 35, 63, 36, 50, 49, 111, 105, 97, and 11;

C.I. Solvent Red 135, 81, 18, 25, 19, 23, 24, 143, 146, and 182;

C.I. Solvent Violet 13;

C.I. Solvent Black 3;

C.I. Solvent Yellow 93; and

C.I. Solvent Green 3.

Further examples of sublimable or diffusible dyes that can be used include anthraquinone dyes, such as Sumikalon Violet RS® (product of Sumitomo Chemical Co., Ltd.), Dianix Fast Violet 3R-FS® (product of Mitsubishi Chemical Corporation.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumickaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Corporation) and Direct Brown M® and Direct Fast Black D® (products of Nippon Kayaku Co. Ltd.); acid dyes such as Kayanol Milling Cyanine 5R® (product of Nippon Kayaku Co. Ltd.); and basic dyes such as Sumicacryl Blue 6G® (product of Sumitomo Chemical Co., Ltd.), and Aizen Malachite Green® (product of Hodogaya Chemical Co., Ltd.); magenta dyes of the structures:

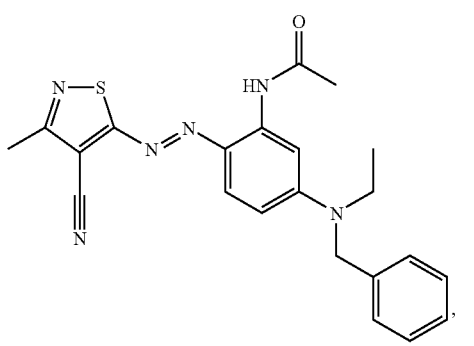

and

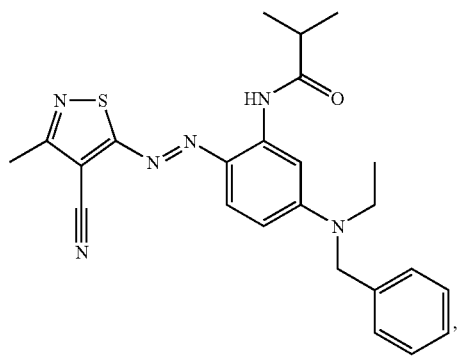

;

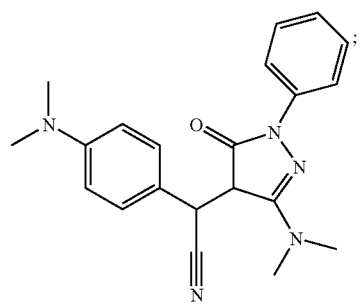

cyan dyes of the structures:

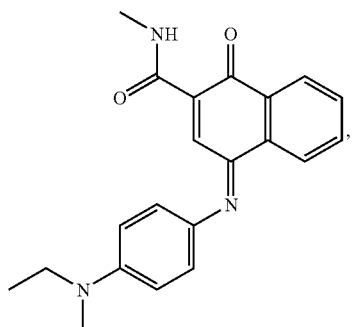

;

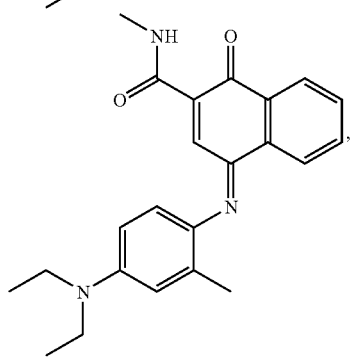

;

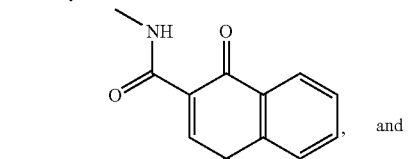

, and

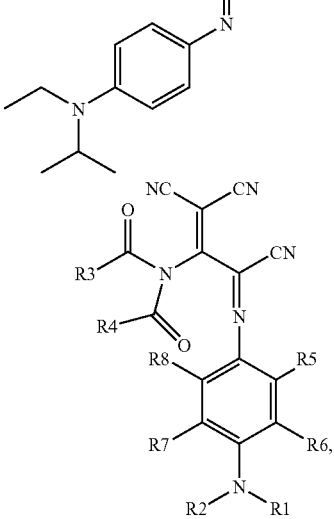

where R1 and R2 each independently represents an alkyl group, a cycloalkyl group, an aryl group, a heterocyclic group, or R1 and R2 together represent the necessary atoms to close a heterocyclic ring, or R1 and/or R2 together with R6 and/or R7 represent the necessary atoms to close a heterocyclic ring fused on the benzene ring; R3 and R4 each independently represents an alkyl group, or an alkoxy group; R5, R6, R7 and R8 each independently represents hydrogen, an alkyl group, a cycloalkyl group, an aryl group, an alkoxy group, an aryloxy group, a carbonamido group, a sulfamido group, hydroxy, halogen, $NHSO_2R_9$, $NHCOR_9$, $OSO_2R_9$, or $OCOR_9$, or R5 and R6 together and/or R7 and R8 together represent the necessary atoms to close one or more heterocyclic ring fused on the benzene ring, or R6 and/or R7 together with R1 and/or R2 represent the necessary atoms to close a heterocyclic ring fused on the benzene ring; and R9 represents an alkyl group, a cycloalkyl group, an aryl group and a heterocyclic group; and yellow dyes of the structures:

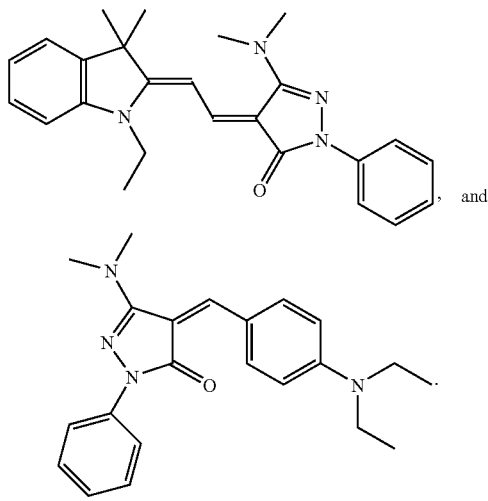

Further examples of useful dyes can be found in U.S. Pat. Nos. 4,541,830; 5,026,677; 5,101,035; 5,142,089; 5,804,531; and 6,265,345, and U.S. Patent Application Publication No. US 20030181331. Suitable cyan dyes can include Kayaset Blue 714 (Solvent Blue 63, manufactured by Nippon Kayaku Co., Ltd.), Phorone Brilliant Blue S-R (Disperse Blue 354, manufactured by Sandoz K.K.), and Waxoline AP-FW (Solvent Blue 36, manufactured by ICI). Suitable magenta dyes can include MS Red G (Disperse Red 60, manufactured by Mitsui Toatsu Chemicals, Inc.), and Macrolex Violet R (Disperse Violet 26, manufactured by Bayer). Suitable yellow dyes can include Phorone Brilliant Yellow S-6 GL (Disperse Yellow 231, manufactured by Sandoz K.K.) and Macrolex Yellow 6G (Disperse Yellow 201, manufactured by Bayer). The dyes can be employed singly or in combination to obtain a monochrome dye-donor layer or a black dye-donor layer. The dyes can be used in an amount of from 0.05 g/m2 to 1 g/m2 of coverage. According to various embodiments, the dyes can be hydrophobic.

Each dye-donor layer patch can range from 20 wt. % to 90 wt. % dye, relative to the total dry weight of all components in the layer. A high amount of dye is desirable for increased efficiency, but higher amounts of dye can lead to increased occurrences of donor/receiver sticking. Depending on the efficiency of the dye-donor layer, a lower amount of dye can be used to achieve the same efficiency as a different dye-donor layer. The dye percent is ideally chosen in view of the specific donor and receiver combination. Varying the amount of dye in the donor can aid in matching the efficiency between different dye patches, for example, a cyan, magenta, and yellow patch. For example, yellow and/or magenta patch dye amounts can be between 20 wt. % and 75 wt. % dye relative to the total dry weight of all components in the layer, for example, between 30 wt. % and 50 wt. %. A cyan patch dye amount can be between 40 wt. % and 90 wt. % dye relative to the total dry weight of all components in the layer, for example, between 55 wt. % and 75 wt. %.

To form a dye-donor layer, one or more dyes can be dispersed in a polymeric binder, for example, polycarbonate; poly(styrene-co-acrylonitrile); poly(sulfone); poly(phenylene oxide); polystyrene; phenoxy resin; acrylic resin such as poly(methyl acrylate), poly(methyl methacrylate), and poly(butyl methacrylate); poly(vinyl acetate); cellulose derivatives such as but not limited to cellulose acetate hydrogen phthalate, cellulose acetate, cellulose acetate propionate, cellulose acetate butyrate, or cellulose triacetate; a hydroxyalkyl cellulose, such as hydroxypropyl cellulose, methylhydroxypropyl cellulose, hydroxypropylmethyl cellulose; polyacetals; poly(vinyl butyral); poly(vinyl pental); polyvinylhexal; poly(vinyl heptal); ethyl cellulose; or a combination thereof. The binder can be used in an amount of from 0.05 g/m² to 5 g/m².

The dye-donor layer of the dye-donor element can be formed or coated on a support. The dye-donor layer composition can be dissolved in a solvent for coating purposes. The dye-donor layer can be formed or coated on the support by techniques such as, but not limited to, a gravure process, spin-coating, solvent-coating, extrusion coating, or other methods known to practitioners in the art.

The support can be formed of any material capable of withstanding the heat of thermal printing. According to various embodiments, the support can be dimensionally stable during printing. Suitable materials can include polyesters, for example, poly(ethylene terephthalate) and poly(ethylene naphthalate); polyamides; polycarbonates; glassine paper; condenser paper; cellulose esters, for example, cellulose acetate; fluorine polymers, for example, poly(vinylidene fluoride), and poly(tetrafluoroethylene-co-hexafluoropropylene); polyethers, for example, polyoxymethylene; polyacetals; polystyrenes; polyolefins, for example, polyethylene, polypropylene, and methylpentane polymers; polyimides, for example, polyimide-amides and polyether-imides; and combinations thereof. The support can have a thickness of from 1 μm to 30 μm, for example, from 3 μm to 7 μm.

According to various embodiments, a subbing layer, for example, an adhesive or tie layer, a dye-barrier layer, or a combination thereof, can be coated between the support and the dye-donor layer. The subbing layer can be one or more layers. The adhesive or tie layer can adhere the dye-donor layer to the support. Suitable adhesives are known to practitioners in the art, for example, Tyzor TBT® from E.I. DuPont de Nemours and Company. The dye-barrier layer can include a hydrophilic polymer. The dye-barrier layer can provide improved dye transfer densities.

The dye-donor element can include a slip layer to reduce or prevent print head sticking to the dye-donor element. The slip layer can be coated on a side of the support opposite the dye-donor layer. The slip layer can include a lubricating material, for example, a surface-active agent, a liquid lubricant, a solid lubricant, or mixtures thereof, with or without a polymeric binder. Suitable lubricating materials can include oils or semi-crystalline organic solids that melt below 100° C., for example, poly(vinyl stearate), beeswax, perfluorinated alkyl ester polyether, poly(caprolactone), carbowax, polyethylene homopolymer, or poly(ethylene glycol). The lubricating material can also be a silicone- or siloxane-containing polymer. Suitable polymers can include graft co-polymers, block polymers, co-polymers, and polymer blends or mixtures. Suitable polymeric binders for the slip layer can include poly(vinyl alcohol-co-vinyl butyral), poly(vinyl alcohol-co-vinyl acetal), poly(styrene), poly(vinyl acetate), cellulose acetate butyrate, cellulose acetate, ethyl cellulose, and other binders as known to practitioners in the art. The amount of lubricating material used in the slip layer is dependent, at least in part, upon the type of lubricating material, but can be in the range of from 0.001 to 2 g/m2, although less or more lubricating material can be used as needed. If a polymeric binder is used, the lubricating material can be present in a range of 0.1 to 50 weight %, preferably 0.5 to 40 weight %, of the polymeric binder.

The dye-donor element can include a stick preventative agent to reduce or eliminate sticking between the dye-donor element and the receiver element during printing. The stick preventative agent can be present in any layer of the dye-donor element, so long as the stick preventative agent is capable of diffusing through the layers of the dye-donor element to the dye-donor layer, or transferring from the slip layer to the dye-donor layer. For example, the stick preventative agent can be present in one or more patches of the dye-donor layer, in the support, in an adhesive layer, in a dye-barrier layer, in a slip layer, or in a combination thereof. According to various embodiments, the stick preventative agent can be in the slip layer, the dye-donor layer, or both. According to various embodiments, the stick preventative agent can be in the dye-donor layer. The stick preventative agent can be in one or more colored patches of the dye-donor layer, or a combination thereof. If more than one dye patch is present in the dye-donor layer, the stick preventative agent can be present in the last patch of the dye-donor layer to be printed, typically the cyan layer. However, the dye patches can be in any order. For example, if repeating patches of cyan, magenta, and yellow are used in the dye-donor element, in that respective order, the yellow patches, as the last patches printed in each series, can include the stick preventative agent. The stick preventative agent can be a silicone- or siloxane-containing polymer. Suitable polymers can include graft co-polymers, block polymers, co-polymers, and polymer blends or mixtures. Suitable stick preventative agents are described, for example, in commonly assigned U.S. applications Ser. No. 10/667,065 to David G. Foster, et al., and Ser. No. 10/729,567 to Teh-Ming Kung, et al.

Optionally, release agents as known to practitioners in the art can also be added to the dye-donor element, for example, to the dye-donor layer, the slip layer, or both. Suitable release agents include, for example, those described in U.S. Pat. Nos. 4,740,496 and 5,763,358.

According to various embodiments, the dye-donor layer can contain no plasticizer. Inclusion of the plasticizer in the dye-donor layer can increase dye-donor efficiency. The dye-donor layer can include plasticizers known in the art, such as those described in U.S. Pat. Nos. 5,830,824 and 5,750,465, and references disclosed therein. Suitable plasticizers can be defined as compounds having a glass transition temperature (Tg) less than 25° C., a melting point (Tm) less than 25° C., or both. Plasticizers useful for this invention can include low molecular weight plasticizers and higher molecular weight plasticizers such as oligomeric or polymeric plasticizers. Examples of suitable plasticizers can include aliphatic polyesters, epoxidized oils, chlorinated hydrocarbons, poly(ethylene glycols), poly(propylene glycols), and poly(vinyl ethyl ether) (PVEE). The molecular weight of the plasticizer can be greater than or equal to 450 to minimize transfer of the plasticizer to the dye-receiving layer during printing. Transfer of some plasticizers to the dye-receiving layer can result in image keeping and stability problems. The plasticizer can be present in an amount of from 1 to 50%, for example, from 5% to 35%, by weight of the binder.

The dye-donor layer can include beads. The beads can have a particle size of from 0.5 to 20 microns, preferably from 2.0 to 15 microns. The beads can act as spacer beads under the compression force of a wound up dye-donor roll, improving raw stock keeping of the dye-donor roll by reducing the material transferred from the dye-donor layer to the slipping layer, as measured by the change in sensitometry under accelerated aging conditions, or the appearance of unwanted dye in the laminate layer, or from the backside of the dye-donor element, for example, a slipping layer, to the dye-donor layer. The use of the beads can result in reduced mottle and improved image quality. The beads can be employed in any amount effective for the intended purpose. In general, good results have been obtained at a coverage of from 0.003 to 0.20 g/m2. Beads suitable for the dye-donor layer can also be used in the slip layer.

The beads in the dye-donor layer can be crosslinked, elastomeric beads. The beads can have a glass transition temperature (Tg) of 45° C. or less, for example, 10° C. or less. The elastomeric beads can be made from an acrylic polymer or copolymer, such as butyl, ethyl-, propyl-, hexyl-, 2-ethyl hexyl-, 2-chloroethyl-, 4-chlorobutyl- or 2-ethoxyethyl-acrylate or methacrylate; acrylic acid; methacrylic acid; hydroxyethyl acrylate; a styrenic copolymer, such as styrene-butadiene, styrene-acrylonitrile-butadiene, styrene-isoprene, or hydrogenated styrene-butadiene; or mixtures thereof. The elastomeric beads can be crosslinked with various crosslinking agents, which can be part of the elastomeric copolymer, such as but not limited to divinylbenzene; ethylene glycol diacrylate; 1,4-cyclohexylene-bis(oxyethyl) dimethacrylate; 1,4-cyclohexylene-bis(oxypropyl)diacrylate; 1,4-cyclohexylene-bis(oxypropyl) dimethacrylate; and ethylene glycol dimethacrylate. The elastomeric beads can have from 1 to 40%, for example, from 5 to 40%, by weight of a crosslinking agent. The beads in the dye-donor layer can be hard polymeric beads. Suitable beads can include divinylbenzene beads, beads of polystyrene crosslinked with at least 20 wt. % divinylbenzene, and beads of poly(methyl methacrylate) crosslinked with at least 20 wt. % divinylbenzene, ethylene glycol dimethacrylate, 1,4-cyclohexylene-bis(oxyethyl) dimethacrylate, 1,4-cyclohexylene-bis(oxypropyl) dimethacrylate, or other crosslinking monomers known to those familiar with the art.

The dye-donor element can be a sheet of one or more colored patches or laminate, or a continuous roll or ribbon. The continuous roll or ribbon can include one patch of a monochromatic color or laminate, or can have alternating areas of different patches, for example, one or more dye patches of cyan, magenta, yellow, or black, one or more laminate patches, or a combination thereof. Dye patches and laminate patches may be single layer or multilayer. Laminate patches can have adhesive layers to aid in adhesion to a dye receiving element.

Figure 8:
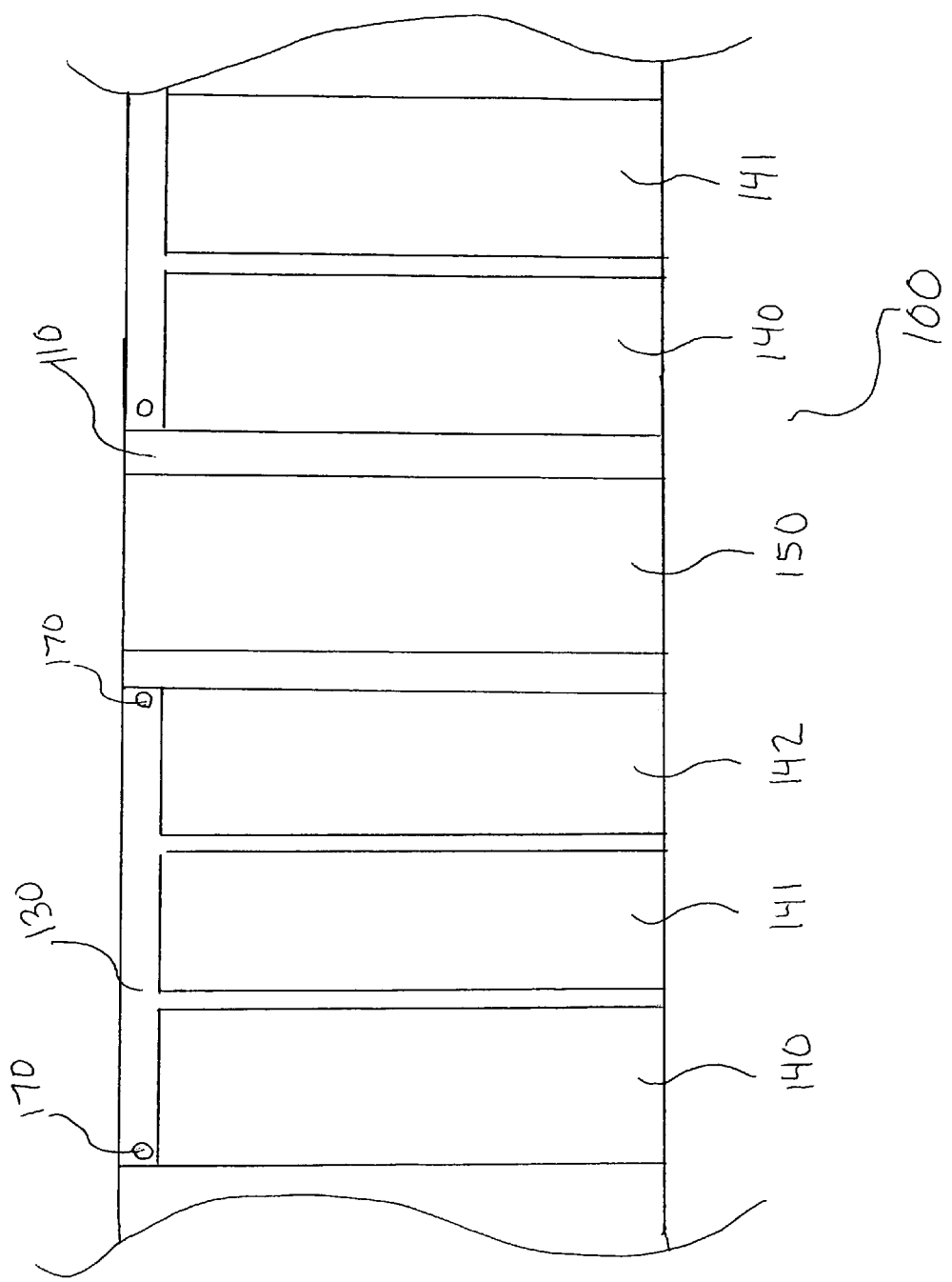
FIG. 8 is a top down view of a thermal dye transfer donor, which may be manufactured with the present invention.

According to one embodiment of the invention, a thermal transfer donor 100 is prepared by providing a support 110 to which a patterned transparent adhesive layer 130 with alignment feature 170 is applied first, as shown in FIG. 8. Alignment feature 170 can be used to align laminate patch 150 so that it is only applied to the uncoated area of the support. Alignment feature 170 can be used to align dye patches 140, 141, and 142 so that they are applied only on top of transparent adhesive layer 130. The donor is also provided with adhesive layer 120 and slip layer 125 (shown in FIG. 9).

Alignment feature 170 is shown as a circular uncoated portion, but it can be any shape or size. FIG. 8 shows the dye patches applied only partially across the width of the substrate. However, the alignment feature can be placed in the transparent layer such that the dye patches can be applied completely across the width of the substrate. The alignment feature can also be an edge of the coated transparent adhesive layer 130.

Figure 9:
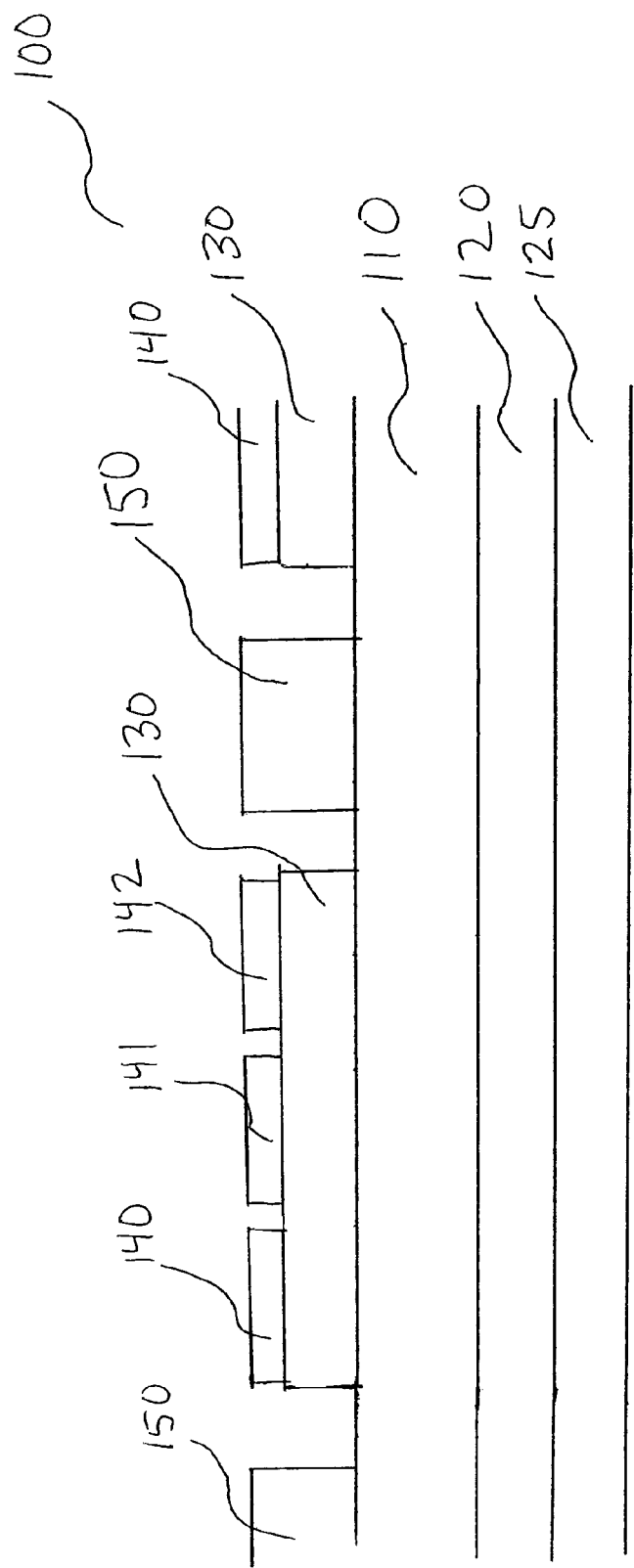
FIG. 9 is a side view of a thermal dye transfer donor, which may be manufactured with the present invention.

Referring to FIG. 9, the practice of the method of the invention enables precise alignment of the dye patches on the transparent adhesive layer and alignment of the laminate patch on the portion of the substrate not coated with adhesive layer.

Figure 10:
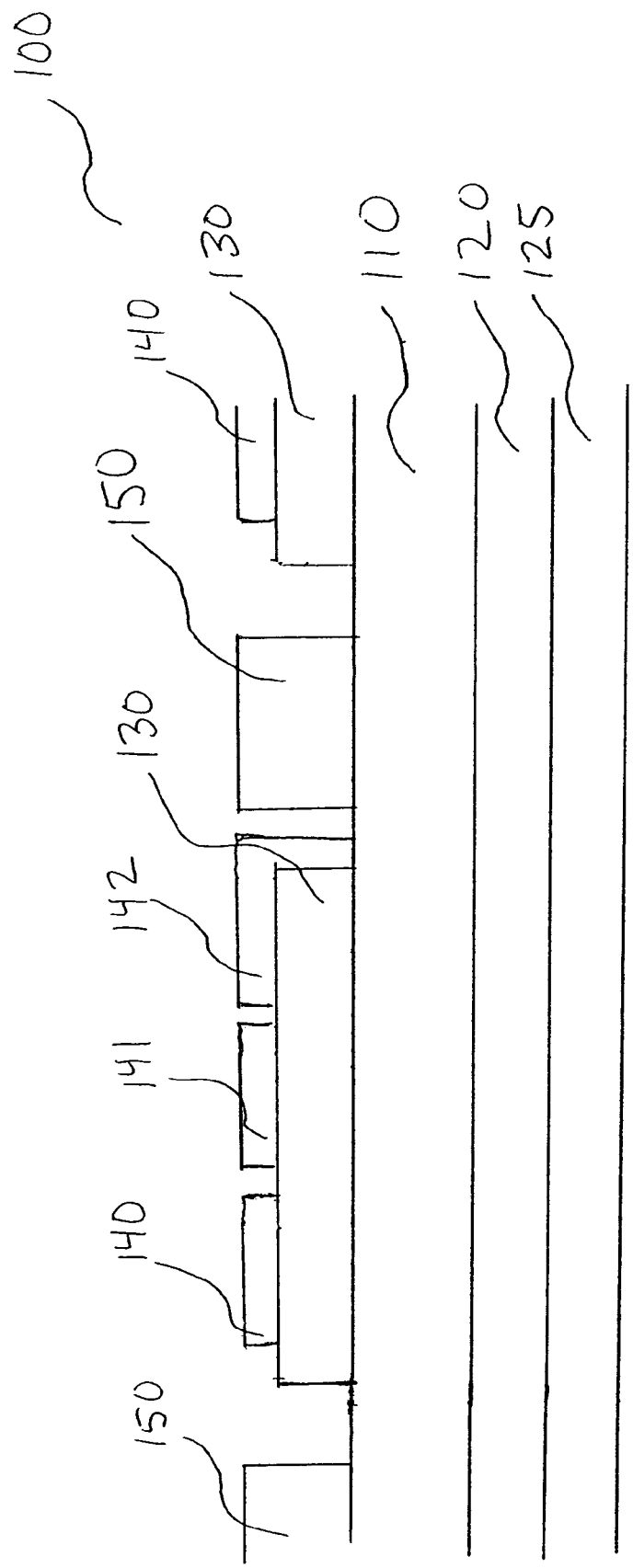
FIG. 10 is a side view of a thermal dye transfer donor, not manufactured with the present invention.

Referring to FIG. 10, thermal transfer donor not manufactured with the present invention can result in misalignment of the dye patches on the transparent adhesive layer resulting in dye patch 142 having a portion coated on the uncoated portion of the substrate.

Dye donor layers can be applied to the transparent adhesive layer upon detection of the alignment feature according to the method of the invention, and subsequently adjusting the relative speed of the substrate and the applicator of the dye patch, such as a gravure cylinder, to align each of the dye donor layers to ensure application of each dye patch onto the transparent adhesive layer. The protective laminate can be applied on the portion of the substrate not coated with the transparent adhesive layer in a similar fashion.

It is possible that the laminate patch can sufficiently transparent such that the laminate layer can be applied first with the alignment feature. If layers 120 or 125 are sufficiently transparent, it may also be possible to apply the alignment feature to these layers to facilitate alignment.

The alignment feature can be removed from the final coated product during slitting and spooling processes to prepare the dye donor elements for use in thermal printing systems.

The dye donor element can also include registration patches for use by thermal printers, not shown in FIGS. 8 through 10. The registration patches can also be applied according to the method of the invention. Registration patches are typically black and can be applied between each dye patch or only at the start and end of each group of cyan, magenta, yellow, and laminate patches, for example.

EXAMPLES

The following examples are provided to illustrate the invention.

Example 1

The error associated with pre-printing an alignment feature and then aligning the etching process to the feature versus creating the alignment feature during the etching process has been shown to be in the order of 0.001 inches, three sigma in both the x and y direction for a high precision machine using cameras, blob analysis and a Cartesian alignment mechanism. For less sophisticated equipment, the alignment error could be of a much larger magnitude. Even with precise equipment, alignment errors complicate the manufacture of segmented and pixilated displays and will increase waste and limit the ability to create small features in the case of segmented displays and in the case of pixilated displays making interconnection to high dpi displays more difficult.

The experiments were intended to estimate the precision with which a laser etched fiducial could be found. For that work, we evaluated the performance on both ITO putter-coated and uncoated PET support, also referred to as web stock. In general, we found that an LED based illumination scheme provided the best compromise for working on both types of support. A field of view of approximately ½ inch was imaged by a 640×480 pixel camera. That field of view size was chosen based on the performance projections of the web/support conveyance hardware. (That is, the index precision of the machine.) On un-coated base, one standard deviation in the measured line separation was 0.281 pixel or 0.000220" (Based on 45 measurements.) On coated base, one standard deviation in the measured line separation was 0.350 pixel or 0.000273" (using 35 measurements) Recall that the line separation was measured as an indication of the ability to measure the position of fiducials. This is the fundamental nugget of data that represents the value of measuring fiducials. The benefit of measuring fiducials that were made use the same marking equipment as the first functional feature is that the variability finding the fiducials prior to creating the functional feature is eliminated.

The invention has been described in detail with particular reference to certain preferred embodiments thereof, but it will be understood that variations and modifications can be effected within the spirit and scope of the invention.

The invention claimed is:

1. A method of aligning layers in a multilayer product comprising
    providing a support,
    forming a transparent first patterned layer having areas of transparent material and areas without material where the first patterned layer includes an alignment feature capable of scattering light,
    illuminating said support, and said transparent first patterned layer with oblique lighting,
    providing an analysis system capable of sensing scattered light from said alignment feature and referencing,
    sensing said scattered light from said alignment feature;
    referencing said scattered light from said alignment feature to a position on said support; and
    forming a second patterned layer aligned with the first patterned layer.

2. The method of claim 1 wherein said support comprises a flexible support.

3. The method of claim 1 wherein said support is a transparent specular support.

4. The method of claim 3 wherein said providing an analysis system capable of sensing scattered light from said alignment feature further comprises providing a light trap for absorbing a portion of said oblique light and said scattered light, wherein said portion has passed through said transparent specular support.

5. The method of claim 3 wherein said providing an analysis system capable of sensing scattered light from said alignment feature further comprises providing a light dump for directing away a portion of said oblique light and said scattered light, wherein said portion has passed through said transparent specular support.

6. The method of claim 1 wherein said support is an opaque specular support.

7. The method of claim 1 wherein said support is at least 3 microns in thickness.

8. The method of claim 1 wherein said support comprises polyester.

9. The method of claim 1 wherein said support comprises aliphatic polyolefin.

10. The method of claim 9 wherein said aliphatic polyolefin comprises high density polyethylene (HDPE), low density polyethylene (LDPE), polypropylene, and oriented polypropylene (OPP).

11. The method of claim 1 wherein said transparent layer comprises a conductive material.

12. The method of claim 11 wherein said conductive material is conductive ink.

13. The method of claim 11 wherein said conductive material is polythiophene.

14. The method of claim 11 wherein said conductive material is ITO.

15. The method of claim 1 wherein said patterning ablates or damages said support.

16. The method of claim 1 wherein said alignment feature is a diffuse reflective surface area.

17. The method of claim 1 wherein said illuminating comprises dark field illumination.

18. The method of claim 1 wherein said oblique lighting comprises ultraviolet lighting.

19. The method of claim 1 wherein said oblique lighting comprises visible lighting.

20. The method of claim 13 wherein said oblique lighting comprises infrared lighting.

21. The method of claim 1 wherein said oblique lighting comprises LED based illumination.

22. The method of claim 1 wherein said oblique lighting comprises a fiber optic cold light source configured as a ring light with a shallow exit angle.

23. The method of claim 1 wherein said oblique lighting comprises 20 a fiber optic cold light source configured as a line light.

24. The method of claim 1 wherein said oblique lighting comprises an array of light emitting diodes arranged to form a line.

25. The method of claim 1 wherein said oblique lighting comprises an array of light emitting diodes arranged to form a ring.

26. The method of claim 1 wherein said oblique lighting comprises a point source with a suitably located collimating optic.

27. The method of claim 1 wherein said oblique lighting comprises a laser arranged to strike the surface obliquely.

28. The method of claim 1 wherein said analysis system capable of sensing scattered light from said alignment feature is a lens in combination with a camera.

29. The method of claim 1 wherein said analysis system capable of sensing scattered light from said alignment feature and referencing is a solid-state camera interfaced to a computer.

30. The method of claim 1 wherein said analysis system capable of sensing scattered light from said alignment feature and referencing comprises a camera, lens, and a processor utilizing an algorithm.

31. The method of claim 1 wherein said second operation comprises a coating or screen printing operation.

32. The method of claim 31 wherein said coating operation comprises at least one member selected from the group consisting of coating a light modulating material, coating a second electrically conductive layer, and coating a functional layer.

33. The method of claim 31 wherein said second operation comprises gravure coating of at least one member selected from the group consisting of adhesive layers, dye patches, protective laminate patches, and registration bars.

34. The method of claim 33 wherein said dye patches and said laminate patches are multilayer patches.

35. The method of claim 1 wherein said patterning at least said transparent layer to produce a pattern comprises patterning said support and said transparent layer.

36. The method of claim 1 wherein forming the alignment feature is etched by a laser and the patterned layer comprises ITO.

* * * * *